(12) United States Patent
Bao et al.

(10) Patent No.: US 12,204,517 B2
(45) Date of Patent: *Jan. 21, 2025

(54) ADAPTIVE COMPRESSION OPTIMIZATION FOR EFFECTIVE PRUNING

(71) Applicant: SAP SE, Walldorf (DE)

(72) Inventors: Junze Bao, Walldorf (DE); Norman May, Karlsruhe (DE); Robert Schulze, Walldorf (DE); Christian Lemke, Heidelberg (DE); Wei Zhou, Walldorf (DE)

(73) Assignee: SAP SE, Walldorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/933,903

(22) Filed: Sep. 21, 2022

(65) Prior Publication Data
US 2023/0025952 A1 Jan. 26, 2023

Related U.S. Application Data

(63) Continuation of application No. 16/220,688, filed on Dec. 14, 2018, now Pat. No. 11,500,842.

(51) Int. Cl.
*G06F 16/22* (2019.01)
*G06F 7/36* (2006.01)
(Continued)

(52) U.S. Cl.
CPC ............ *G06F 16/2282* (2019.01); *G06F 7/36* (2013.01); *G06F 16/2237* (2019.01);
(Continued)

(58) Field of Classification Search
None
See application file for complete search history.

(56) References Cited

U.S. PATENT DOCUMENTS

| 9,720,931 B2 * | 8/2017 | Tyercha | G06F 16/86 |
| 2008/0294676 A1 * | 11/2008 | Faerber | G06F 16/2455 |
| | | | 707/999.102 |

(Continued)

OTHER PUBLICATIONS

Amazon redshift database developer guide (api version Dec. 1, 2012). https://docs.aws.amazon.com/redshift/latest/dg/t_Sorting_data.html.

(Continued)

*Primary Examiner* — Dawaune A Conyers
(74) *Attorney, Agent, or Firm* — Mintz Levin Cohn Ferris Glovsky and Popeo, P.C.

(57) ABSTRACT

A database management system is described that can encode data to generate a plurality of data vectors. The database management system can perform the encoding by using a dictionary. The database management system can adaptively reorder the plurality of data vectors to prepare for compression of the plurality of data vectors. During a forward pass of the adaptive reordering, most frequent values of a data vector of the plurality of data vectors can be moved-up in the data vector. During a backward pass of the adaptive reordering, content within a rest range of a plurality of rest ranges can be rearranged within the plurality of data vectors according to frequencies of the content. The reordering according to frequency can further sort the rest range by value. Related apparatuses, systems, methods, techniques, computer programmable products, computer readable media, and articles are also described.

18 Claims, 32 Drawing Sheets

(51) Int. Cl.
G06F 16/2455 (2019.01)
H03M 7/30 (2006.01)
(52) U.S. Cl.
CPC .... *G06F 16/2272* (2019.01); *G06F 16/24556* (2019.01); *H03M 7/30* (2013.01)

(56) References Cited

U.S. PATENT DOCUMENTS

| | | | | |
|---|---|---|---|---|
| 2011/0016118 | A1* | 1/2011 | Edala | G06F 16/951 |
| | | | | 707/730 |
| 2013/0166566 | A1* | 6/2013 | Lemke | G06F 16/24553 |
| | | | | 707/E17.051 |
| 2014/0019422 | A1* | 1/2014 | Franke | G06F 16/2282 |
| | | | | 707/687 |
| 2016/0292220 | A1* | 10/2016 | Verma | G06F 16/24561 |
| 2017/0116242 | A1* | 4/2017 | Chavan | G06F 16/2452 |

OTHER PUBLICATIONS

Abadi, D. et al., "Integrating compression and execution in col. oriented database systems." In Proceedings of the 2006 ACM SIGMOD International Conference on Management of Data, SIGMOD '06, pp. 671-682, New York, NY, USA, 2006. ACM.

Machado dos Reis, A. "Incremental Learning Applied to Streaming Environments." Federal University of Rio Grande Do Sul Computer Institute, Computer Science Course, 2017 (61 pages).

Baumann, S. et al., "Bitwise dimensional co-clustering for analytical workloads." The VLDB Journal, 25(3):291-316, Jun. 2016.

Beckmann, N. et al., "The rtree: An efficient and robust access method for points and rectangles." SIGMOD Rec., 19(2):322-331, May 1990.

Binnig, C. et al., "Dictionary-based order-preserving string compression for main memory column stores." In Proceedings of the 2009 ACM SIGMOD International Conference on Management of Data, SIGMOD '09, pp. 283-296, New York, NY, USA, 2009. ACM.

Bruni, P., "Optimizing DB2 queries with IBM DB2 analytics accelerator for z/OS." IBM redbooks. IBM Corp., International Technical Support Organization, Poughkeepsie, NY, 2012. Number on back cover: SG24-8005-00.

Cormack, G.V., "Data compression on a database system." Commun. ACM, 28(12):1336-1342, Dec. 1985.

Graefe, G. "Query evaluation techniques for large databases." ACM Comput. Surv., 25(2):73-169, Jun. 1993.

Hellerstein, J.M. et al., "Generalized search trees for database systems." In Proceedings of the 21th International Conference on Very Large Data Bases, VLDB '95, pp. 562-573, San Francisco, CA, USA, 1995. Morgan Kaufmann Publishers Inc.\.

IBM® PureData system for analytics, version 7.2.1 https://www.ibm.com/support/knowledgecenter/en/SSULQD_7.2.1/com.ibm.nz.adm.doc/c_sys adm_zone_map_format.html.

Iyer, B.R. et al., "Data compression support in databases." In Proceedings of the 20th International Conference on Very Large Data Bases, VLDB '94, pp. 695-704, San Francisco, CA, USA, 1994. Morgan Kaufmann Publishers Inc.

Kaser, O. et al., "Attribute value reordering for efficient hybrid olap." Information Sciences, 176(16):2304-2336, 2006.

Lang, H. et al., "Data blocks: Hybrid oltp and olap on compressed storage using both vectorization and compilation." In Proceedings of the 2016 International Conference on Management of Data, SIGMOD '16, pp. 311-326, New York, NY, USA, 2016. ACM.

Lemire, D. et al., "Reordering columns for smaller indexes." Inf. Sci., 181(12):2550-2570, Jun. 2011.

Lemke, C. et al., "Speeding up queries in column stores." In Data Warehousing and Knowledge Discovery, pp. 117-129, Berlin, Heidelberg, 2010. Springer Berlin Heidelberg.

Moerkotte, G. "Small materialized aggregates: a lightweight index structure for data warehousing." Jan. 1998.

Olken, F. et al., "Rearranging data to maximize the efficiency of compression." In Proceedings of the Fifth ACM SIGACT-SIGMOD Symposium on Principles of Database Systems, PODS '86, pp. 78-90, New York, NY, USA, 1986. ACM.

Plattner, H. "A common database approach for oltp and olap using an in-memory column database." In Proceedings of the 2009 ACM SIGMOD International Conference on Management of Data, SIGMOD '09, pp. 1-2, New York, NY, USA, 2009. ACM.

Postgresql 9.5. documentation, chapter 62. brin indexes. https://www.postgresql.org/docs/9.5/static/brin-intro.html.

Pourabbas, E. et al., "Minimizing index size by reordering rows and columns." In Anastasia Ailamaki and Shawn Bowers, editors, Scientific and Statistical Database Management, pp. 467-484, Berlin, Heidelberg, 2012. Springer Berlin Heidelberg.

Sidirourgos, L. et al., "Column imprints: A secondary index structure." In Proceedings of the 2013 ACM SIGMOD International Conference on Management of Data, SIGMOD '13, pp. 893-904, New York, NY, USA, 2013. ACM.

Sidirourgos, L. et al., "Scaling column imprints using advanced vectorization." In Proceedings of the 13th International Workshop on Data Management on New Hardware, Damon '17, pp. 4:1-4:8, New York, NY, USA, 2017. ACM.

Stonebraker, M. et al., "C-store: A column-oriented dbms." In Proceedings of the 31st International Conference on Very Large Data Bases, VLDB '05, pp. 553-564. VLDB Endowment, 2005.

Sun, L. et al., "Skipping-oriented partitioning for columnar layouts." Proc. VLDB Endow., 10(4):421-432, Nov. 2016.

Texeira, E. et al., "MetisIDX—From Adaptive to Predictive Data Indexing," Proceedings of the 21st International Conference on Extending Database Technology (EDBT), Mar. 26-29, 2018, (4 pages).

Zhang, H. et al., "Reducing the storage overhead of main-memory oltp databases with hybrid indexes." In Proceedings of the 2016 International Conference on Management of Data, SIGMOD '16, pp. 1567-1581, New York, NY, USA, 2016. ACM.

Ziauddin, M. et al., "Dimensions based data clustering and zone maps." Proc. VLDB Endow., 10(12):1622-1633, Aug. 2017.

* cited by examiner

202

| Name | Function |
|---|---|
| Uncompressed | the original column is still dictionary encoded, but its data vector is not further compressed |
| Prefix Encoding | for a column with many same values only on top, separate the prefix value from the data vector |
| Sparse Encoding | for a column with many same values both on top and scattered in the rest of the column, separate the prefix value from the data vector, use a bit vector to indicate the positions of non-prefix values and only store non-prefix values in the data vector |
| Cluster Encoding | a column is partitioned into fixed-size blocks, and blocks with a single distinct value is compressed in the data vector, with a bit vector indicating which blocks are compressed |
| Indirect Encoding | a block based scheme similar to cluster encoding if there are more than one, but still only a few distinct values in each block, each block can then be further dictionary encoded |
| Run Length Encoding | storing the repeated values and the start position of each value |
| Linear Run Length Encoding | based on Run Length Encoding, but the values in each run are linearly increasing instead of being the same |

FIG. 2

FIG. 5(a) Full column scan without any index

FIG. 5(b) Min-max index construction and usage

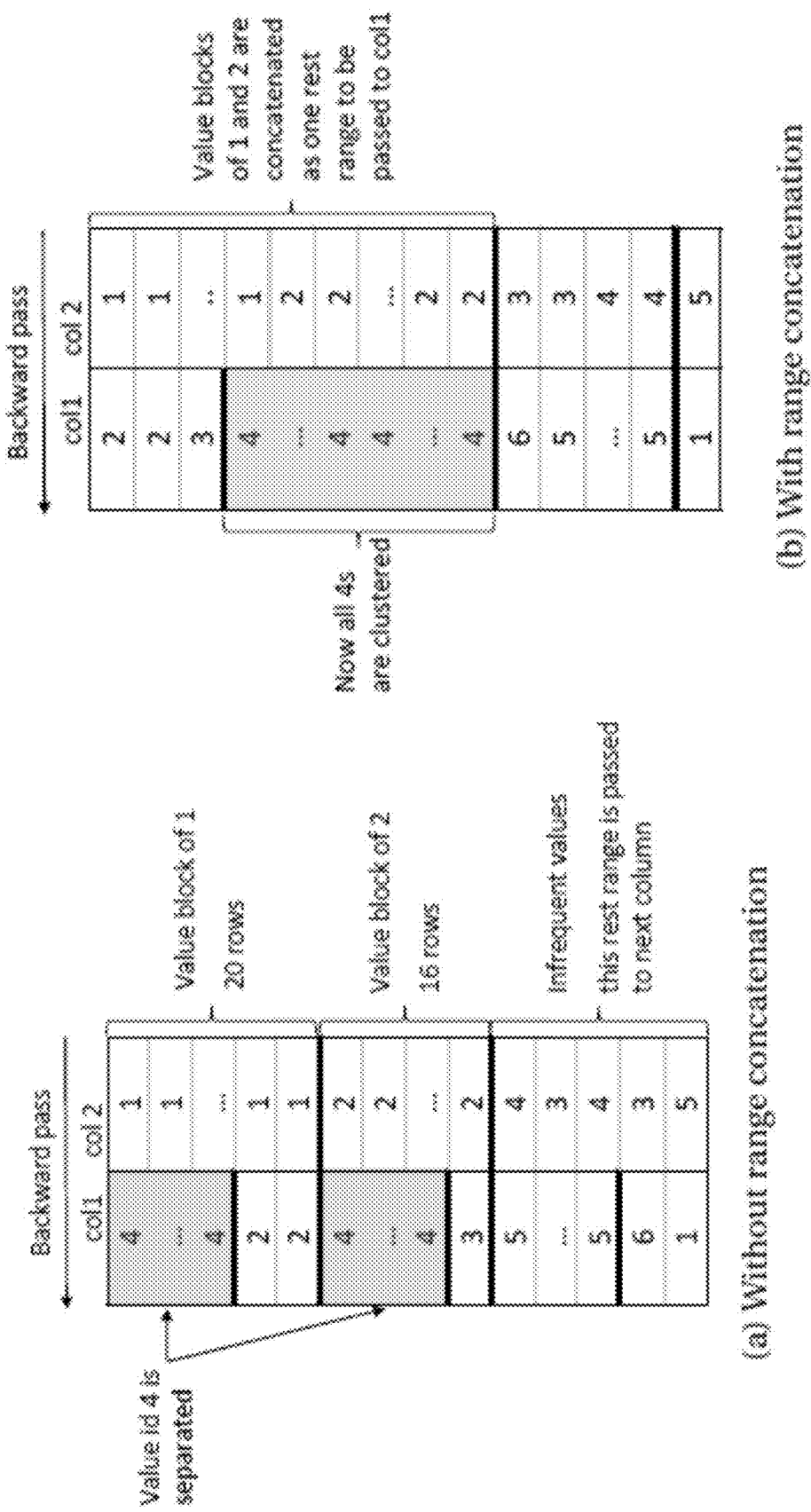
FIG. 9(a) Without range concatenation
FIG. 9(b) With range concatenation w/o range concatenation | with range concatenation

... | 1 | 2 | 3 | 4 | 5 | 6 | 7 | 8 | 9 | 10 | 11 | 12 | 13 | 14 | 15 | 16 | ...

The whole range is considered as a new rest range due to the low-frequency threshold The whole range is partitioned into 4 smaller subranges Each block has around 50 rows

| Parameter Name | Value Example | Note |
|---|---|---|
| table_path | /tmp/data/lineitem.csv | the absolute path of the csv file to be read in |
| table_separator | , | one char denoting the delimiter of the csv file |
| column_names | c1,c2,c3,c4,c5 | column names for the csv file |
| table_columns | c1,c2,c3 | columns that need to be read into the framework |
| oc_columns | c1,c3 | columns that need to be considered in the compression optimization phase |
| queries | c1:<2;c2:=2;c3:(0,3) | a list of *(column_name:query_value)* pairs; a query_value consists of an operator and a list of operands, e.g. =x, [x, y) |
| permutation | false | whether to test all permutations of *oc_columns* as different column selection order in compression optimization |
| output | /tmp/lineitem.data | the absolute path of the experiment output |
| test_types | sortByValue, sortByFreq, noMMI | a list of preset scenario settings, e.g. whether to build min-max index for scanning, or different sorting strategies in compression optimization |

| LINEITEM (6m rows) | | ORDERS (1.5m rows) | |
|---|---|---|---|
| Column Name | % of Distinct Values | Column Name | % of Distinct Values |
| L_EXTENDEDPRICE | 15.565 % | O_ORDERSTATUS | 0.00002 % |
| L_TAX | 0.00015% | O_TOTALPRICE | 79.53 % |
| L_SHIPDATE | 0.0421 % | O_ORDERDATE | 0.016 % |
| L_COMMITDATE | 0.0411 % | O_ORDERPRIORITY | 0.000033% |

FIG. 15

|  | Scan Time | | Number of Scanned Rows | |
|---|---|---|---|---|
|  | Positive | Negative | Positive | Negative |
| count | 77 | 4 | 76 | 3 |
| mean | 21.84% | -28.31% | 23.40% | -42.42% |
| std | 16.57% | 34.58% | 17.46% | 40.02% |
| min | 0.59% | -74.17% | 0.64% | -81.89% |
| 25% | 08.48% | -45.47% | 10.79% | -62.69% |
| 50% | 18.61% | -18.88% | 20.23% | -43.49% |
| 75% | 32.53% | -1.72% | 33.92% | -22.68% |
| max | 59.41% | -1.33% | 64.18% | -1.87% |

FIG. 25

|  | Compression Size | | Compression Optimization Time | |
|---|---|---|---|---|
|  | Positive | Negative | Positive | Negative |
| count | 61 | 20 | 24 | 57 |
| mean | 8.20% | -11.06% | 21.67% | -32.22% |
| std | 13.00% | 17.02% | 20.44% | 38.10% |
| min | 0.00% | -56.69% | 0.33% | -149.62% |
| 25% | 1.05% | -12.11% | 5.94% | -44.44% |
| 50% | 2.90% | -3.77% | 17.75% | -16.54% |
| 75% | 9.37% | -0.68% | 35.34% | -8.22% |
| max | 64.07% | -0.07% | 61.69% | -0.54% |

FIG. 26

|  | Scan Time | | Number of Scanned Rows | |
|---|---|---|---|---|
|  | Positive | Negative | Positive | Negative |
| count | 79 | 2 | 79 | 2 |
| mean | 35.64% | -25.55% | 38.13% | -27.25% |
| std | 24.73% | 35.06% | 27.01% | 37.82% |
| min | 1.05% | -50.35% | 0.00% | -54.00% |
| 25% | 15.32% | -37.95% | 16.12% | -40.63% |
| 50% | 28.06% | -25.55% | 30.10% | -27.25% |
| 75% | 52.41% | -13.16% | 56.49% | -13.88% |
| max | 92.49% | -0.76% | 98.04% | -0.51% |

FIG. 29

|  | Compression Size | | Compression Optimization Time | |
|---|---|---|---|---|
|  | Positive | Negative | Positive | Negative |
| count | 32 | 49 | 25 | 56 |
| mean | 13.44% | -10.55% | 25.59% | -80.90% |
| std | 14.44% | 12.55% | 15.86% | 95.40% |
| min | 0.00% | -65.03% | 0.24% | -455.19% |
| 25% | 1.97% | -17.25% | 18.57% | -102.36% |
| 50% | 6.69% | -6.26% | 24.11% | -56.83% |
| 75% | 20.95% | -2.13% | 35.03% | -16.96% |
| max | 55.39% | -0.009% | 52.31% | -1.30% |

FIG. 31

ADAPTIVE COMPRESSION OPTIMIZATION FOR EFFECTIVE PRUNING

CROSS REFERENCE TO RELATED APPLICATION

This application is a continuation of U.S. patent application Ser. No. 16/220,688 filed on Dec. 14, 2018, entitled "ADAPTIVE COMPRESSION OPTIMIZATION FOR EFFECTIVE PRUNING". The entire contents of this application are incorporated herein by reference in its entirety.

TECHNICAL FIELD

The subject matter described herein relates to adaptive compression optimization for effective pruning in a database management system.

BACKGROUND

Structured querying language (SQL) queries are usually executed by comparing queried values with each row in a table, i.e. a full table scan. Columnar databases reduce the scanned data to specific columns instead of rows, and indexes further reduce the amount of scanned data by pruning some data early. The min-max index in a database management system, such as SAP HANA, is one of the indexes which prunes data using block-wise aggregate values in a column. Such min-max index logically partitions a column into fixed-size blocks and stores the minimum and maximum values of each block. By comparing the queried values with stored min and max values, the min-max index can prune a large amount of data in a column before scanning. However, the effectiveness of min-max indexes (MMIs) largely depends on the data order of a column. Additionally, in a database management system such as SAP HANA, there is a compression optimization phase which can reorder the data for column compression and causes MMIs to be ineffective in most cases. Therefore, there exists a need to adapt this compression optimization phase to MMIs without destroying compression metrics.

SUMMARY

The subject matter described herein relates to adaptive compression optimization for effective pruning in a database management system. Such compression optimization can involve, among other things, employing a new reordering strategy and a new order to choose a column/row candidate for compression optimization. This new approach can decrease the scan time by 28% on average and only increases the compression size by less than 10% in most cases.

In one aspect, a database management system can encode a plurality of columns or rows of data to generate a plurality of data vectors. The database management system can perform the encoding by using a dictionary. The database management system can adaptively reorder the plurality of data vectors to prepare for compression of the plurality of data vectors.

In some variations one or more of the following features can optionally be included in any feasible combination. The adaptive reordering can include: determining, by the database management system and for each data vector of the plurality of data vectors, a prefix part and a non-prefix part; and applying, by the database management system, a min-max index to the non-prefix part of each data vector. The database management system can separately store a value of the prefix part and a length of the prefix part.

In some implementations, the adaptive reordering can include sorting a plurality of rest ranges within the plurality of data vectors by value. The sorting by value can include grouping close value identifiers together. The adaptive reordering can include sorting the plurality of rest ranges within the plurality of data vectors by frequency. The adaptive reordering can include: moving-up, by the database management system and during a forward pass of the adaptive reordering, most frequent values of a data vector of the plurality of data vectors in the data vector; and reordering, by the database management system and during a backward pass of the reordering, content within a rest range of the plurality of rest ranges according to frequencies of the content, the reordering according to frequency further sorting the rest range by value. The sorting the rest range by value can include grouping close value identifiers together. The rest range can be prevented from being split during the sorting by value.

In further implementations, the adaptive reordering can include concatenating, by the database management system, two or more rest ranges of the plurality of rest ranges based on at least one of value and frequency of content within the plurality of rest ranges. The adaptive reordering can include determining a selection order of the plurality of data vectors in which each data vector is processed prior to the compression. The determining of the selection order can include distributing, by the database management system, the plurality of data vectors into a first group, a second group and a third group. The first group can include most number of distinct values and the third group comprising least number of distinct values. The database management system can prioritize the second group in the selection order. Note that the ideas need not only work in column stores, but the skipping can also work on row stores and potentially other kind of database systems.

Related apparatuses, systems, methods, techniques and articles are also described and within the scope of this disclosure.

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features. Similarly, computer systems are also described that may include one or more processors and one or more memories coupled to the one or more processors. A memory, which can include a non-transitory computer-readable or machine-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to the SAP HANA database management system, it should be readily understood that such features are not intended to be limiting. The claims that follow this disclosure are intended to define the scope of the protected subject matter.

The details of one or more variations of the subject matter described herein are set forth in the accompanying drawings and the description below. Other features and advantages of the subject matter described herein will be apparent from the description, the drawings, and the claims.

BRIEF DESCRIPTION OF DRAWINGS

FIG. 2 illustrates compression schemes in the database management system such as SAP HANA;

FIG. 5(a) illustrates the comparison between the predicate values and the column value being done row by row in a plain full column scan;

FIG. 5(b) illustrates the usage of a min-max index: first compare min/max values with the predicate values, and then scan necessary blocks only;

FIG. 9(a) illustrates sorting rest range of two columns by value ids, where range is not concatenated (i.e., without range concatenation);

FIG. 9(b) illustrates sorting rest range of two columns by value ids, where range is concatenated (i.e., with range concatenation);

FIG. 11 illustrates splits caused by range concatenation;

FIG. 12 illustrates different compression sizes caused by different column selection order;

FIG. 14 illustrates configurable parameters of the framework being placed in a file, in the format of parameter_name=parameter_value per line;

FIG. 15 illustrates candidate columns being chosen from LINEITEM and ORDERS;

FIG. 25 illustrates statistics of the histograms in FIG. 24;

FIG. 26 illustrates statistics of the histograms for FIG. 27;

FIG. 29 illustrates statistics of the histograms for FIG. 28;

FIG. 31 illustrates statistics of the histograms for FIGS. 30(a) and 30(b); and

Like reference numerals in various drawings indicate like elements.

DETAILED DESCRIPTION

Figure 1:
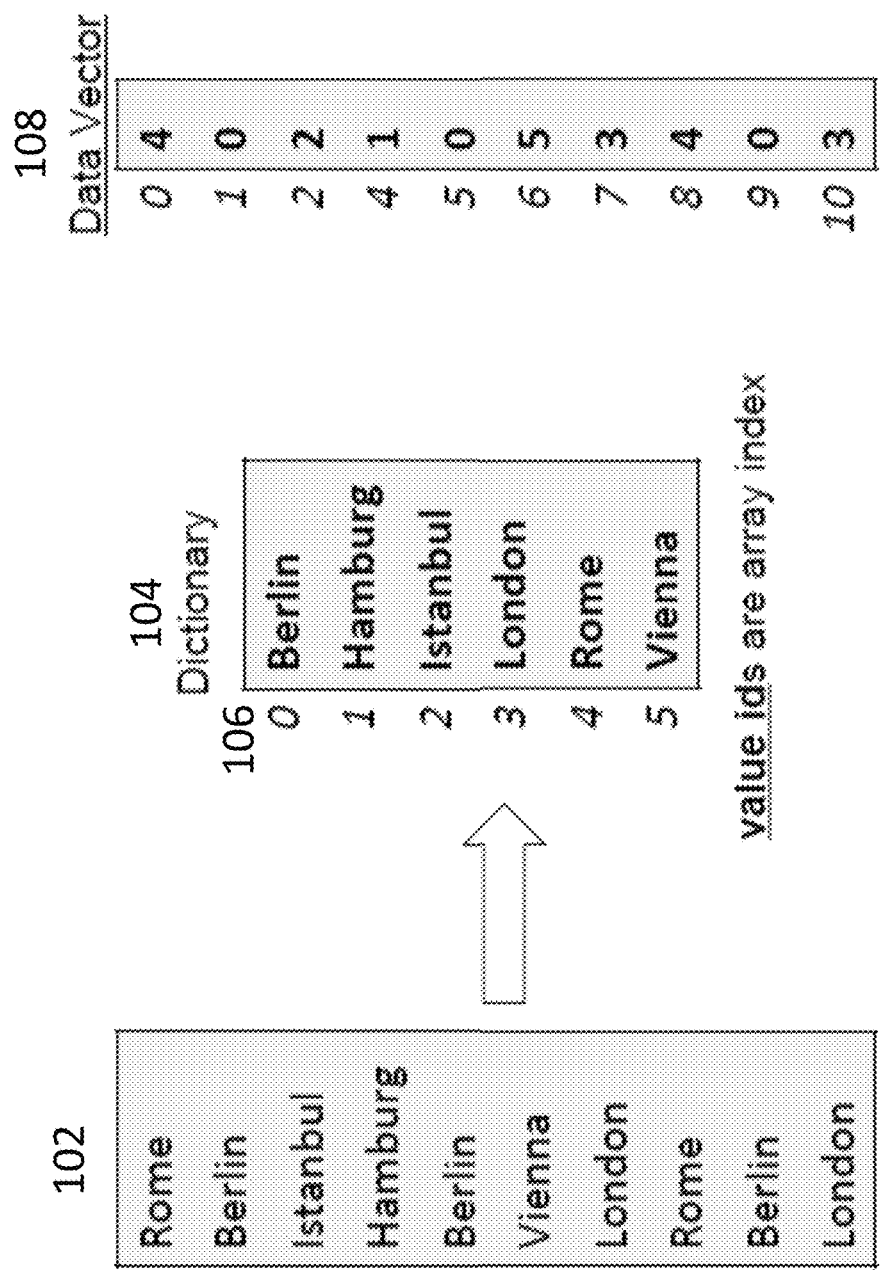
FIG. 1 illustrates dictionary encoding in the database management system such as SAP HANA.

Despite an ever-growing data size, an efficient database management system (DBMS) is required to answer queries in a reasonably short time. A Structured Query Language (SQL) query is usually executed by comparing queried values with each row in a table, i.e. by a full table scan, but full table scans are expensive in terms of CPU consumption and input/output utilization in search of requested data in hundreds of millions of records. Indexes were therefore used to accelerate the query processing by narrowing the scan range, if not locating the exact results with indirection. However, full table scans are inevitable if no index or other options are available. It then becomes important to reduce the amount of data to be scanned in an enterprise-oriented database aiming at big data.

One technique to reduce the amount of data is data pruning. Databases apply data pruning techniques on different levels. On a coarser level, tables can be partitioned into columns and accesses to some columns can be pruned based on the metadata of the table. Therefore, columnar databases have become the de facto standard in online analytical processing (OLAP) scenarios, where analytical queries on only a small subset of all columns are more common than in online transaction processing (OLTP). In a columnar database, finer pruning granularity can be achieved by logically partitioning columns into fixed-size blocks and doing block-wise scans. Small Materialized Aggregates (SMA) can speed up query processing. SMA basically stores some precomputed aggregate values, such as minimum, maximum and count values for a block of rows. SMAs targeted disk-based row stores where some rows were stored in pages and helped to load only useful pages. Precomputed aggregate values are also helpful in answering queries asking for aggregates. A block of rows can be skipped by just comparing these aggregate values with predicates. There are many variant implementations inspired by SMA in several database vendors, including IBM DB2, PostgreSQL and Oracle among others.

The min-max index (MMI) in a database management system, such as SAP HANA, is yet another adaption of SMA for pruning blocks in a column. An MMI on a column contains only the minimum and maximum values of blocks in the column. The goal of building MMIs is to achieve effective pruning for queries, e.g. to quickly determine whether a block should be skipped. It manages to achieve the goal with little lookup overhead and low memory consumption. On the other hand, it can potentially slow down the queries due to ineffectiveness caused by two reasons. One is that the effectiveness of min-max indexes depends on the order of data in the column. For example, MMIs on a sorted column outperform those on a uniform, randomly distributed column, as elaborated in the section below on min-max indexes. Besides, there is no generally optimal value for the min-max index block size. A large block size will weaken the pruning ability of min-max indexes while a small block size causes more comparison time between queried values and min-max values and a higher memory consumption.

These problems with MMIs can be solved by having another phase in the database management system, such as SAP HANA, to have the column reordered just to improve the effectiveness of MMIs, but it will conflict with the existing compression optimization phase which reorders the data for optimal compression. Therefore, this compression optimization phase can be exploited to adapt it to MMIs so that MMIs are effective for most columns while not sacrificing the original measurement metrics of this phase, specifically compressed sizes and the time to get the optimal row order. In the meantime, the compression optimization phase is necessary and important in the database management system, such as SAP HANA, because it determines the best compression schemes for the whole table depending on the compression goal, either for smaller size or for faster decompression speed for example. Having tables in compressed forms helps to reduce memory usage and input/output requests considering that the database management system, such as SAP HANA, is an in-memory database. Beyond that, full column scans of compressed columns can already prune some data if the compression reduces the stored data. The full column scan for run length encoded columns, for example, involves only the unique values of a column instead of the whole rows. Our new approaches, such as the new column selection order in compression optimization, for the adaptive compression optimization phase decrease the uncompressed scan time with MMIs by 28% and the number of scanned rows by 30% on average. The original performance metrics are even improved in half cases with the new approaches. Compared to the previous compression optimization phase which is only concerned with compression, our novel new ideas outperform in various aspects. Based on these ideas, this disclosure illustrates the corresponding implementation step by step.

This disclosure first discussed below compression and MMIs. Next, the disclosure presents an exemplary compression optimization phase in the database management system, such as SAP HANA, followed by explanation of MMIs and its issues. By showing how to adapt the compression optimization phase to MMIs, and some adjustments to previous min-max index implementation, this disclosure then explains the core idea that works for both restrictions. Subsequently this disclosure presents measurement experiments on real-world datasets and result analysis to prove the technical advantages of the subject matter described herein.

Compression Optimization in the Database Management System, Such as SAP HANA:

This section introduces compression optimization techniques in a column store of a database management system, such as SAP HANA, that are fundamental for the adaption to MMIs.

Disk-based row-oriented databases maintain only a page buffer cache and other auxiliary structures in memory, primarily leaving actual data on disks. However, this design requires the system to read data from disk whenever a page is not in the page buffer, making I/O requests a bottleneck in some cases. In-memory databases reduce, if not completely eliminate, I/O requests by keeping tables and other primary database objects in main memory at runtime, removing the need for in-memory page caches as well. This becomes achievable because main memory is getting cheaper and it is capable of scaling to terabyte level. Besides, columnar databases store data by column, as opposed to row layout in traditional databases. More efficient data compression on individual columns also makes it feasible to keep tables in main memory when they can be compressed to a reasonably small size. Despite hundreds of gigabyte of main memory available, the volume of in-memory data should be as little as possible so that not only more data can be fitted into main memory, but also more data information can be obtained with less memory access. Hence compression is necessary and important in in-memory databases.

In some implementations consistent with the subject matter described herein, a database management system, such as SAP HANA, is a columnar and in-memory database aiming at managing big data for enterprises, and thus it is more economical to compress in-memory data so that more data fits into main memory. Note however that the techniques described herein can also work without dictionary encoding because the min-max index does not depend on dictionary encoding. Also, the data does not necessarily have to be in-memory. Using a page on disk as a block can lead to even greater benefits of the pruning techniques. The techniques described herein can be applied even for row-stores. Arranging rows for column-wise compression can be less critical in many implementations. Reordering rows for better pruning power can be applied for row-stores as well.

The compression technique is dictionary encoding, which decomposes a column into a dictionary containing all sorted distinct values of the column and a data vector having the real values replaced by corresponding value ids, the implicit index in the dictionary. In FIG. 1, all distinct city names 102 are extracted into the dictionary 104 and mapped to an integer 106. The original column is then represented with a data vector 108 containing only those integer indexes. This dictionary encoding scheme, which employs prefix elimination on the dictionary 104, can save a certain amount of memory especially if there are many duplicates or strings (with a long common prefix) in the column. Besides, there are even more compression that can be done on the resulted integer arrays. The following discussion on columns is based on dictionary-encoded data vectors.

Compression schemes and compression optimization is now described.

FIG. 2 illustrates a table 202 presenting various compression schemes for data vectors (e.g., data vector 108) in the database management system, such as SAP HANA. If none of the compression schemes is suitable for a column, that column remains dictionary encoded without further compression. It is then necessary to have one phase, compression optimization, dedicated to determining the best compression scheme for each column. It is also notable that the compression optimization phase mainly focuses on reordering data in the table, and further compression operations such as actually compressing the columns are left to other phases.

During compression optimization, a table can be optimized for having the smallest size, the fastest access or a trade-off state between faster access and smaller size. The compression optimization phase has to reorder rows in the table to have all columns achieve their optimal compression schemes, otherwise it is likely that there may be nothing worth compressing later. There are many greedy heuristics implemented in the database management system, such as SAP HANA, for optimizing the data order, but this disclosure focuses below on the heuristic that may be used by default in production.

Compression optimization workflow is now discussed.

Not all columns are considered as candidate columns for the optimizer in compression optimization. Given a column with N rows and D distinct values, only columns that satisfy the condition D/N<x % are involved. Here x is the threshold 3 mentioned in the section on adaptive compression optimization. It may not make sense to reorder such a column with a very high percentage of unique values because it is very likely that no better compression can be further applied on its data vector. It will also slightly increase the compression optimization time due to more columns to process.

Figure 3:
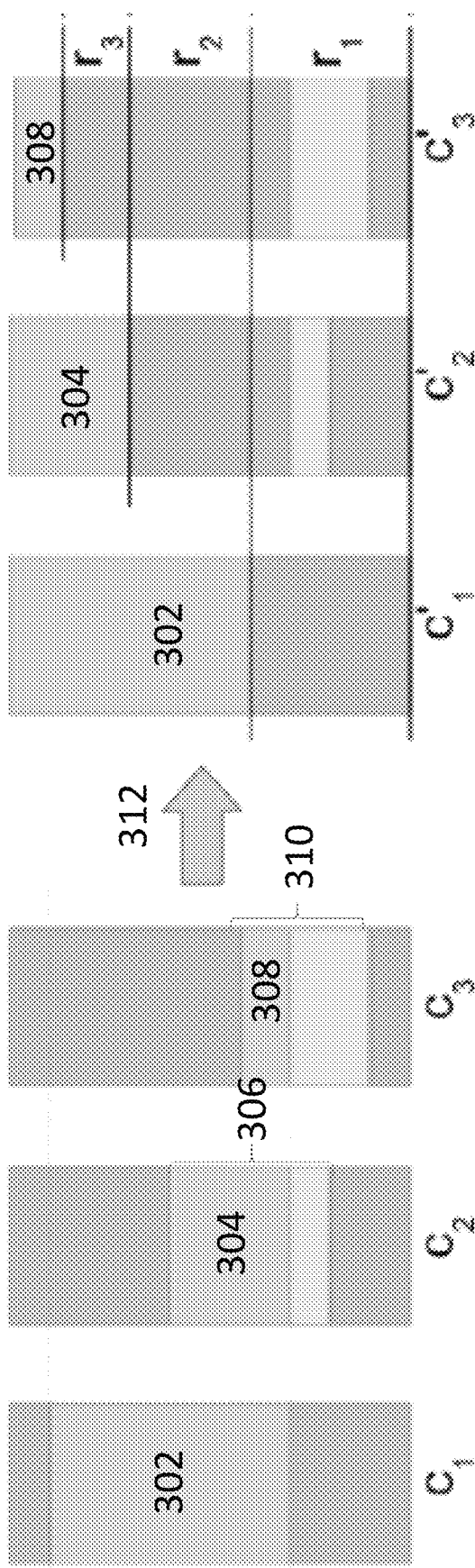
FIG. 3 illustrates a forward pass among the two passes in which the compression optimizer can reorder data.

The compression optimizer can reorder the data in two passes, forward and backward pass. During the forward pass, one heuristic is used to select candidate columns one by one and to move the most-frequent values to the top of the column. One simple heuristic would be to firstly choose the column with a higher frequency of the most frequent value than others. Since implicit value ids are used in the database management system, such as SAP HANA, the order of a certain row range can be decided by only one column. For example, if the range between row 1 and row 1024 is ordered based on the first column, and then all other columns need to reorder themselves accordingly at least in the range between row 1 and row 1024. Hence, when moving up the most-frequent values in each column, the most-frequent value information needs to be updated after processing each column, because in the current column only the most-frequent values in the range of previous' most-frequent-value range are moved up. FIG. 3 illustrates all most-frequent value 302 in $c_1$ are moved up to the top, but for $c_2$, only the upper part 304 of most-frequent values 306 are moved up because they share the same row indexes with most-frequent values in $c_1$. The same reasoning applies to $c_3$ as well, where only the upper part 308 of most-frequent values 310 are moved up. Columns are then partitioned into a prefix and several rest ranges after the forward pass 312. The forward pass moves up the most frequent values. $r_1$, $r_2$, and $r_3$ are generated rest ranges. The ranges defined by 302, 304 and 308 are prefixes.

The backward pass works as follows: columns are chosen one by one in the reversed order of the forward pass (with the default heuristic). The first few columns in the backward pass will then have more opportunities to achieve a better compression because they have larger ranges to sort according to their own value ids. The rest ranges $r_1$, $r_2$, and $r_3$ are then sorted by value id frequency in descending order, having more frequent values in this range come before less frequent values. A rest range $r_1$, $r_2$, or $r_3$ is split into a sorted part and an infrequent-values part if there exist frequencies less than some threshold. The sorted part has all values grouped together, forming several value blocks, which individually are seen as new smaller rest ranges for the remaining columns. The infrequent-values part is added to the collection of rest ranges directly, because not sorting on this part gives chances to the remaining columns, hoping a better order in this subrange could be achieved in other columns.

Figure 4:
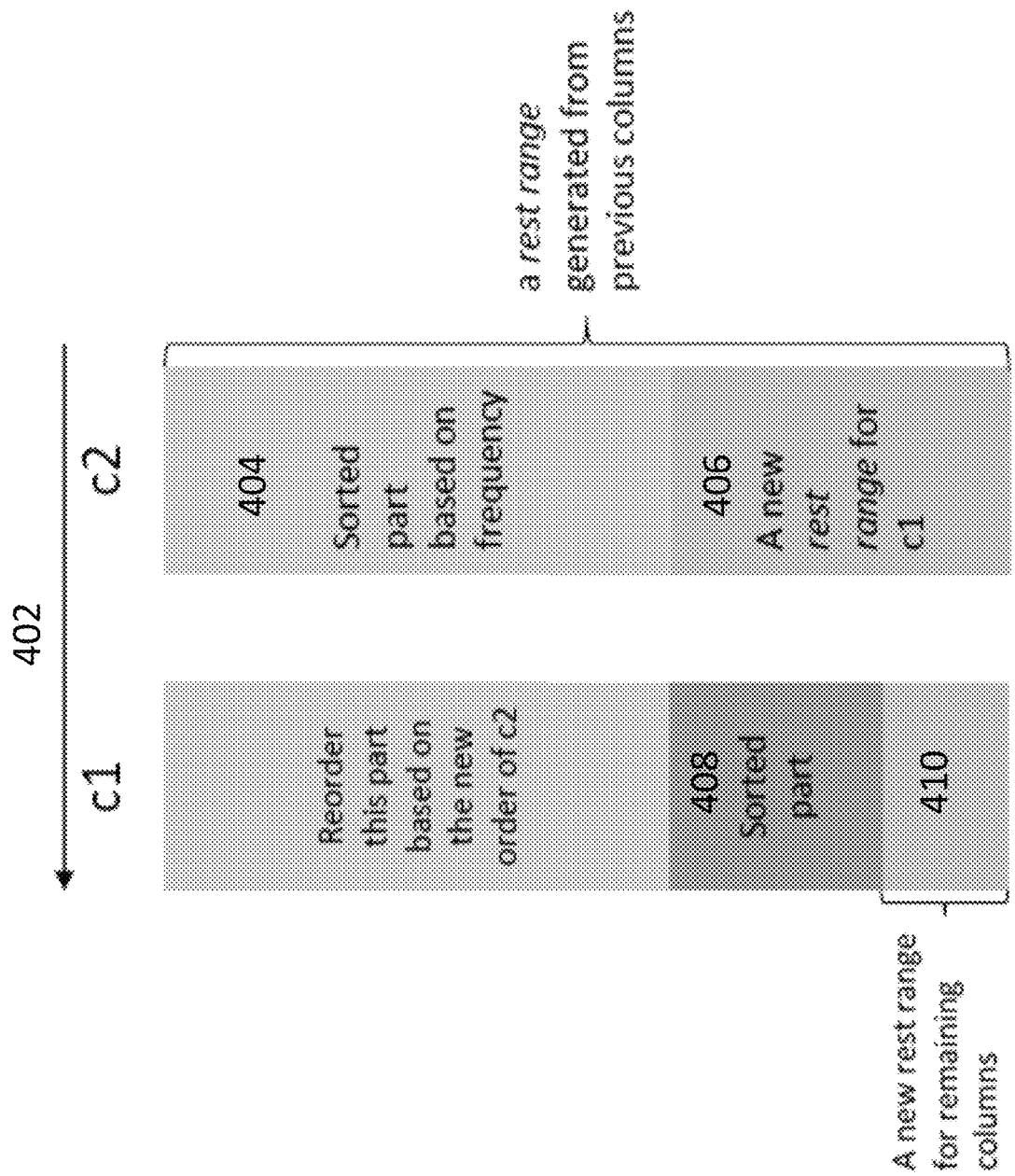
FIG. 4 illustrates a backward pass among the two passes in which the compression optimizer can reorder data.

FIG. 4 illustrates a backward pass 402 going from $c_2$ to $c_1$, splitting each rest range into two parts (e.g., splitting $c_2$ to parts 404 and 406) and generating new smaller rest ranges (e.g., new rest range 406 for $c_2$) for remaining columns. This diagram shows that a rest range in $c_2$ is split into a sorted part 404 and an infrequent-values part 406. $c_1$ keeps splitting the range of $c_2$'s infrequent-values part 406 into parts 408 and 410 while only reorders in $c_2$'s sorted part 404. So new, smaller and non-overlapping rest ranges are generated by the backward pass. Each column gets the opportunity to reorder parts of the whole row range, achieving a balanced state among all columns.

Two things to note here are the column selection order of the two passes and the reordering strategy of those rest ranges. These two factors determine the final data ordering of the whole table on different levels. The column selection orders determine which column gets the priority to reorder rows. If the first few columns are chosen randomly, e.g. a column with more unique values being the first one during the backward pass, the final ordering could be a futile one. On the other hand, different methods bring different side-effects. For example, sorting by frequency would shuffle values around while sorting by value gives sequential order but with various repetitions. Choosing an appropriate sorting strategy can potentially benefit other components in the database management system, such as SAP HANA, when scanning columns with a min-max index.

Min-Max Index:

This section introduces the concept of MMIs, followed by the application of using them to skip block-wise data in full column scans. This section then explains two determining factors of MMIs, block size and data order, and illustrates to what extent they can influence the benefit brought by MMIs.

Definition and usage of min-max index is now explained.

Figures 5A, 5B:
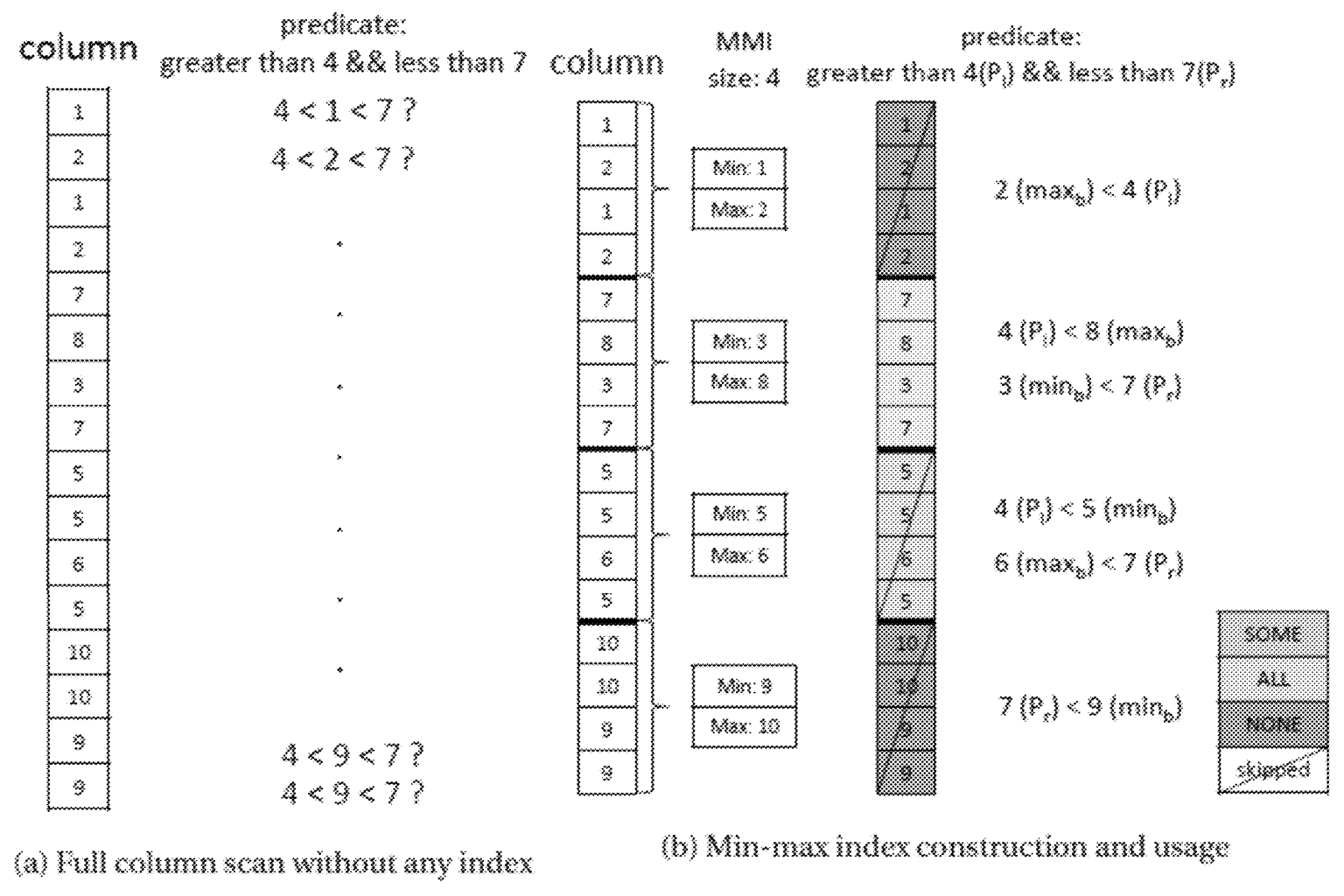

In a columnar database, data is organized in columns, so one full column scan is needed if there is no index available when a predicate comes in. FIG. 5(a) illustrates that the comparison between the predicate values and the column value is done row by row in a plain full column scan. FIG. 5(b) illustrates the usage of a min-max index: first compare min/max values with the predicate values, and then scan necessary blocks only.

In FIG. 5(a), the predicate P, consisting of an operator between and a list of operands, is being queried on the column. Here the between operator is the generalization of =, <, <=, >, and >=operators. A full column scan compares every row with the predicate value to collect the final result, so it can consume a lot of time if the column is extremely large because the scan time is linear in the number of scanned rows. However, building auxiliary MMIs can help to skip some comparisons. A column will be logically partitioned into many blocks of a fixed size before min-max index construction, and then the minimum and maximum values of each block are stored in the min-max index.

Assuming that a predicate has a between operator and two operands $P_l$, $P_r$, i.e. a range query looking for values that are greater than $P_l$ and less than $P_r$, the minimum value of a certain block is mint and the maximum value is $\max_b$, blocks then can be pruned by comparing the index values with the predicate values as shown in the following conditions: (1) If $\max_b<\min_b$, skip the block (NONE); (2) if $P_l<\min_b$ and $\max_b<P_r$, skip scanning the block and add the whole block to the final result (ALL); and (3) otherwise, scan the block (SOME).

Here the NONE, SOME and ALL are the block results after comparing the predicate value with the minimum and maximum values; the block results indicate whether a block needs to be skipped, scanned or skipped but also included in the final result respectively. Similarly, the conditions above can be slightly modified for point queries, i.e. finding the records that equal to $P_v$. In that case, a block will be skipped if $P_v<\min_b$ or $P_v>\max_b$; it will be included in the result if and only if $P_v=\min_b=\max_b$. FIG. 5(b) illustrates how previous full column scan skips blocks with a min-max index. Building a min-max index helps to avoid scanning 12 rows, i.e. 3 blocks, leaving the blue block to be the only one that needs to be scanned.

Factors describing the effectiveness of min-max index is now discussed.

The block size is now discussed. As mentioned above, a min-max index is built on fixed-size blocks, and the block size is a determining factor for its effectiveness. For a column with its min-max index of a very large block size, for instance more than eight thousand rows, the min-max index is very likely to contain most of its unique values and thus will be of little use in skipping blocks. To the other extreme, namely a min-max index of a very small block size, the lookup overhead of comparing predicate values with min-max values is not negligible anymore. Too fine-grained min-max index will also consume more memory because more values need to be stored. A reasonable block size for min-max index should be between 512 and 4096 and be a power of 2 at the same time. It is also worth noting that the overhead for lookup and comparison in the min-max index for a column with less than one million records might be larger than a plain full column scan, so it makes sense to use MMIs only for large tables instead of smaller ones.

A metric named pruning power for measuring the effectiveness of a min-max index can be used. Pruning power is defined as the probability of skipping a block for uniformly distributed range queries in a uniformly distributed column; it is mathematically defined as follows:

$$\rho(m,M)=(1-M-m-1/k)+(m-MIN+1)(MAX-M+1)/k^2$$

where m and M are the minimum and maximum (exclusive) value of a given min-max index block, MIN and MAX (inclusive) being the extrema of the whole column, and k=MAX−MIN+1 being the number of distinct values in the column considering the fact that the value ids are the continuous array indexes of the corresponding sorted dictionary. Considering the constraints of uniformity, a more pragmatic approach is taken to measure the effectiveness of MMIs in terms of the scan time with MMIs rather than just its pruning power, because in a realistic enterprise-oriented database, there are too many columns that are not uniform at all. Besides, our implementation of min-max index is later revised to adapt to some corresponding changes in compression optimization phase too. This is elaborated in the section on adaptive compression optimization.

Data order is now described. Another crucial factor that has even larger impact on min-max index is the data order in that a bad data order can potentially put in vain all efforts of building auxiliary MMIs. For example, in the worst case, a min-max index will be completely futile if every block contains at least one global minimum and one global maximum value. This kind of data order will result in literally a full column scan plus the overhead of lookup in the min-max index because the comparison between any predicate and an arbitrary min-max index in this column would lead to a SOME block result, namely a scan on this block. This is also the reason that many databases suggest to cluster the table on the queried columns and build MMIs only on those columns to obtain best effectiveness.

Adaptive Compression Optimization:

This section discussed a problem encountered during the integration between MMIs and some systems described below, due to the characteristics of shuffling around adjacent value ids in the compression optimization phase. This section subsequently describes a slight modification of previously introduced MMIs to further reduce its overhead by exploiting the feature of compression optimization. This section next proposes a new sorting strategy to group value ids, followed by a corresponding complementary idea to take into account the original performance measures. Subsequently, this section suggests another solution from the point of view of the column selection order in the backward pass. The new solution prioritizes columns with a certain percentage of distinct values rather than follow the reversed order of the forward pass.

Issues of min-max index and compression integration are now described.

As noted above under the section on min-max index, MMIs on a sorted column can be quite helpful in skipping blocks because mathematically adjacent value ids are grouped together in a sorted column. However, sorting cannot be used for every column in a table because rows are identified by their positions in the data vector. Complete sorting on one column will bring perfect pruning ability of its min-max index, but since other columns will be reordered according to the newly fixed order, there might be no gain for their MMIs. The scan performance on the entire table will even be reduced on the whole.

In compression optimization phase specifically of the database management system, such as SAP HANA, each column will have a chance to reorder part of the whole range for better compression in terms of the whole table size. As stated in the section on compression optimization above, the forward pass moves up most-frequent values and the backward pass reorders the data in a rest range according to their frequencies. However, it is exactly due to sorting the rest ranges by frequency that the current compression optimization shuffles close values around because value ids themselves are not concerned with compression. Only the number of distinct values and their frequencies matter.

Figure 6:
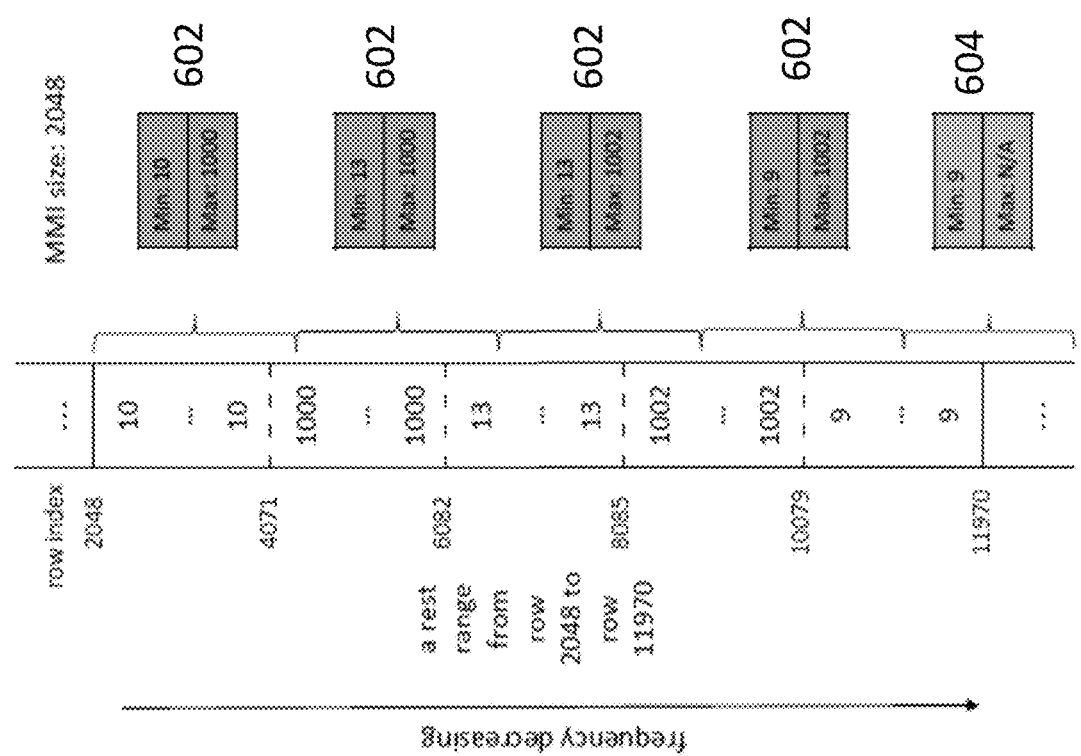
FIG. 6 illustrates a potentially ineffective case where rest ranges (which are formed when columns are partitioned into a prefix and several rest ranges after the forward pass) are sorted by frequency.

It may be intuitive and straightforward to think of the disadvantages of sorting the rest ranges by value frequency for MMIs. Imagine there exist two sets of mathematically distant numbers having close frequencies in a rest range. Sorting by frequency in this range would cause a min-max index block to contain values of very large difference, as illustrated in FIG. 6. This drawing illustrates one worst case for MMIs that can be caused by sorting the rest ranges by frequency. Most MMIs have almost a difference of 1000, making it a necessity for almost all queries to lookup MMIs first and then scan blocks. Mathematically distant value ids are grouped closer to each other due to close frequencies. Most of the min-max differences in this min-max index are too large for most queries. Although some types of compression optimization can achieve good compression in most cases, it can potentially weaken MMIs.

Having another phase to reorder data for MMIs in the database management system, such as SAP HANA, can be too much because MMIs may not be built on all columns eventually if they are not effective even after reordering. That reordering will conflict with the existing reordering of the compression optimization phase as well. It is therefore natural to adapt the compression optimization phase to MMIs to at least improve the benefit of MMIs, if not both. That is why this disclosure explores this phase, where reordering happens, to achieve both good compression and effective MMIs at the same time.

MMIs with prefix are now described.

MMIs are usually created on the whole column, but since the forward pass in the compression optimization phase creates a prefix part of each column, the implementation of MMIs can be modified accordingly. The min-max index is now only needed for the non-prefix part of the column because all values in the prefix are the same, and the prefix itself can be seen as a special large block. Storing the prefix value and its length separately can reduce the lookup overhead and memory consumption if the prefix is fairly large, which is often the case in an enterprise resource planning (ERP) database in that there are a lot of default values in some trivial columns. For example, if the prefix has more than a million rows and the min-max index block size is 2048, the number of lookup and comparison can be reduced from at least 500 to just 1 in this prefix part. Even if there is no obvious prefix in one column, storing the first value as a separate prefix does not increase the memory consumption and lookup overhead much, as there would be only one extra value to look into.

A new sorting strategy is now presented.

Figure 7:
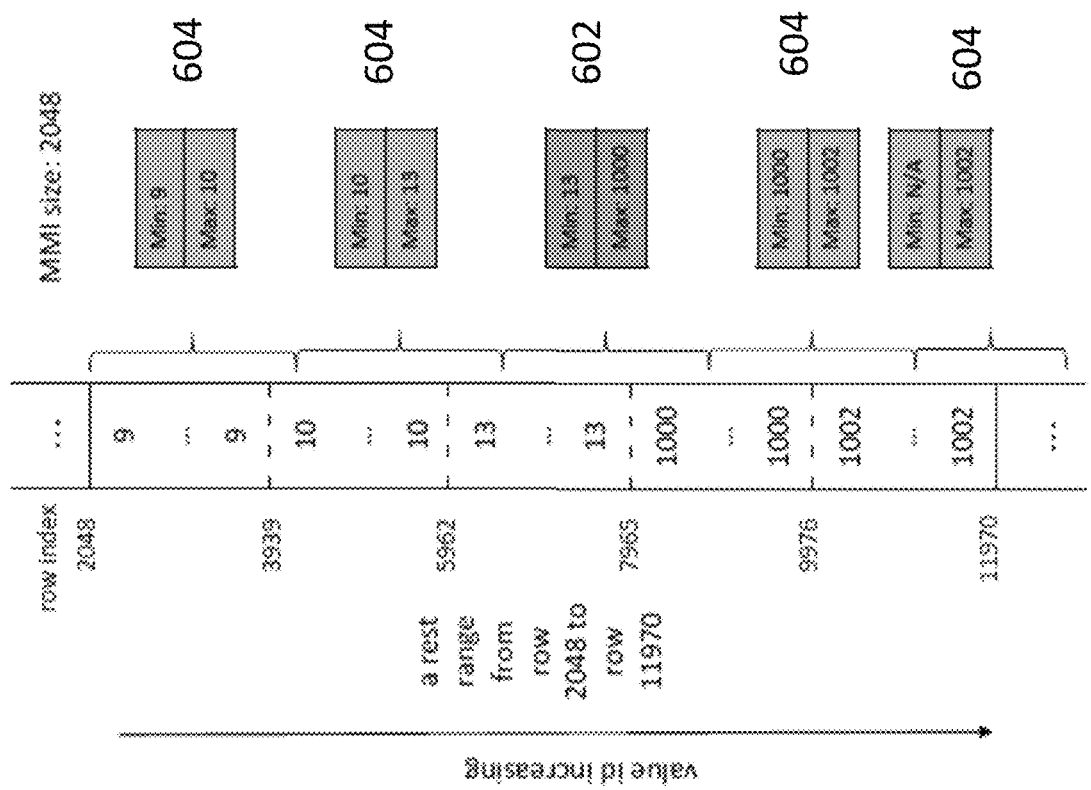
FIG. 7 illustrates solving the potentially ineffective case of FIG. 6 by applying sorting-by-value strategy (e.g., strategy where close value ids are grouped closer) to rest ranges.

As mentioned in the section on compression optimization above, if sorting by frequency for rest ranges shuffles close value ids around due to its ignorance of values, sorting by value turns out to be a better option. Sorting rest ranges by value can solve the problem mentioned earlier without destroying the clustering of the same value, reducing the number of worst blocks, i.e. a min-max index block containing values of very large differences, to at most one, in that specific case, as described in FIG. 7. This drawing illustrates that the worst case for MMIs presented in FIG. 6 is solved by applying the sorting-by-value strategy to rest ranges. The min-max index shown using 602 is an example of a worst case for MMIs. The number of worst blocks (shown using 602) is reduced because close value ids are grouped closer. The blocks 604 in the figure are better than the 602 ones because the min-max difference is much smaller than that in the 604 blocks. Note that reference numerals 602 and 604 reference type of block rather than the block itself.

The sorting-by-value strategy does not necessarily destroy compression in all cases. For example, for run-length encoded columns, because the same values are still grouped together, and only the orders are different from that in the sorting-by-frequency strategy setting. However, it indeed can lead to worse compression, i.e. larger compressed size, in some cases. Suppose a column has value ids of very different frequencies, and cluster encoding is determined to be used on the column after the original compression optimization phase. Values with higher frequency are prioritized, leaving the number of unique values in each cluster to be as little as possible. The last cluster will have to contain the most unique values obviously because the frequency is decreasing. If the new sorting-by-value strategy is applied to this column during compression optimization, values with low frequency would appear in the middle of the column, causing more clusters containing more unique values, and thus worse compression, as described in FIGS. 8(a) and 8(b). These drawings illustrate that a rest range is sorted by two different strategies, leaving different number of unique values in each cluster in the cluster encoding compression scheme.

Figures 8A, 8B:
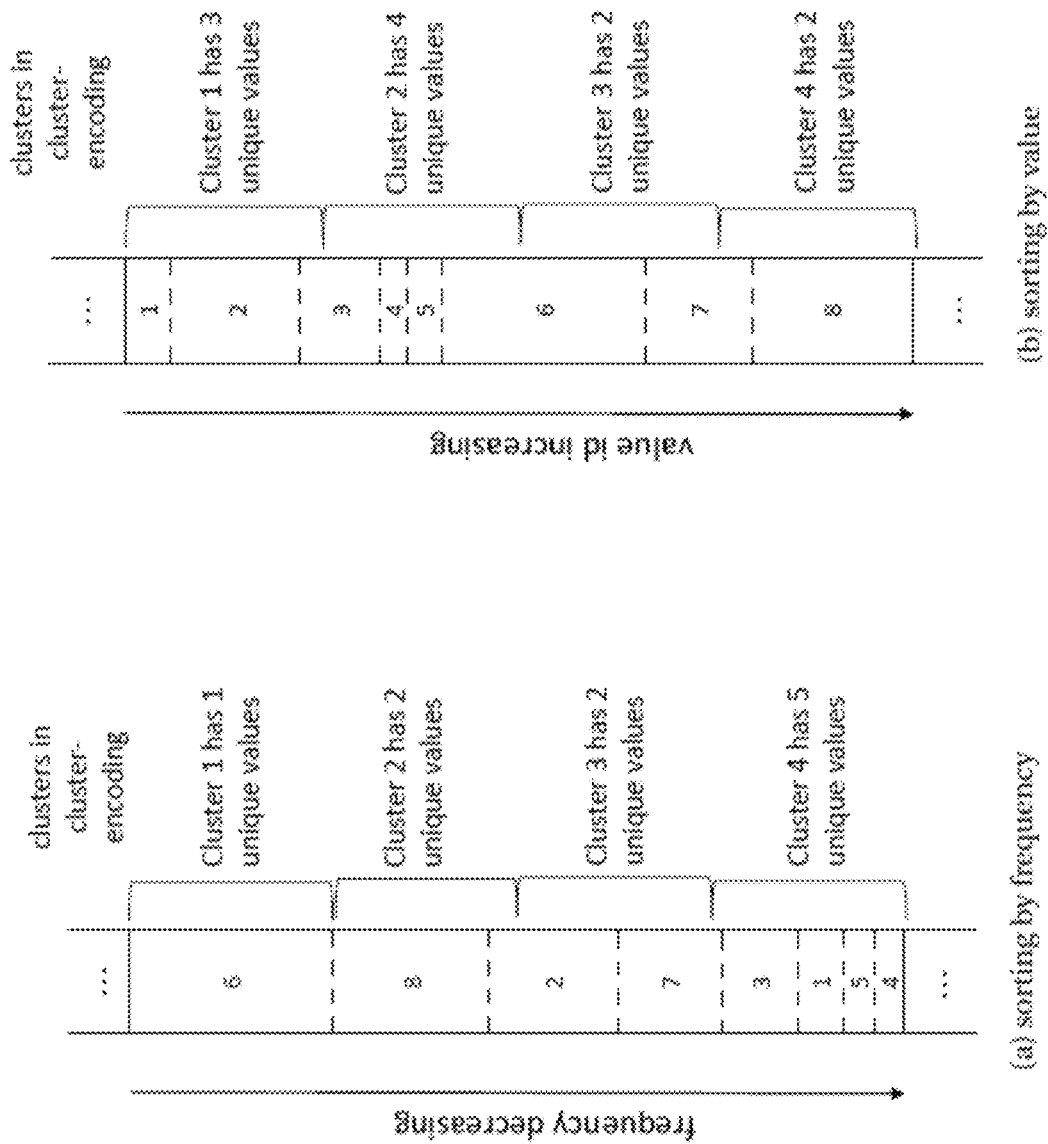
FIG. 8(a) illustrates sorting rest ranges by frequency.
FIG. 8(b) illustrates sorting rest ranges by value.

FIG. 8(a) shows a rest range sorted by frequency, achieving upper clusters containing less unique values, while FIG. 8(b) illustrates the same rest range being sorted by values causes upper clusters to have more unique values. Although the number of unique values of the last cluster in FIG. 8(b) is less than that in FIG. 8(a), sorting the rest range by values still adds one more unique value in total compared to sorting it by frequency. It can potentially incur larger compression sizes in real-world data.

Range concatenation is now described.

Compared to the sorting-by-frequency strategy, a rest range is no longer split into two parts in the sorting-by-value setting, but generating new rest ranges should still exist as otherwise the first column selected in the backward pass will determine the final row order without giving other columns any chance to reorder part of the whole row range. Considering that the clustering of the same value is kept, subranges of the same value, i.e. value blocks as in the sorted part of the sorting-by-frequency setting, can still be treated as new rest ranges. In the sorting-by-frequency setting, those value blocks are passed to remaining columns individually as new rest ranges and the whole other infrequent part is also a new rest range. However in this sorting-by-value setting, value blocks can be concatenated to construct a new larger rest range as long as the number of distinct values within this concatenated range is bounded. It is notable that the infrequent part in rest ranges created when the sorting-by-frequency strategy is used can also be considered as a form of range concatenation in that scenario.

Figures 10A, 10B:
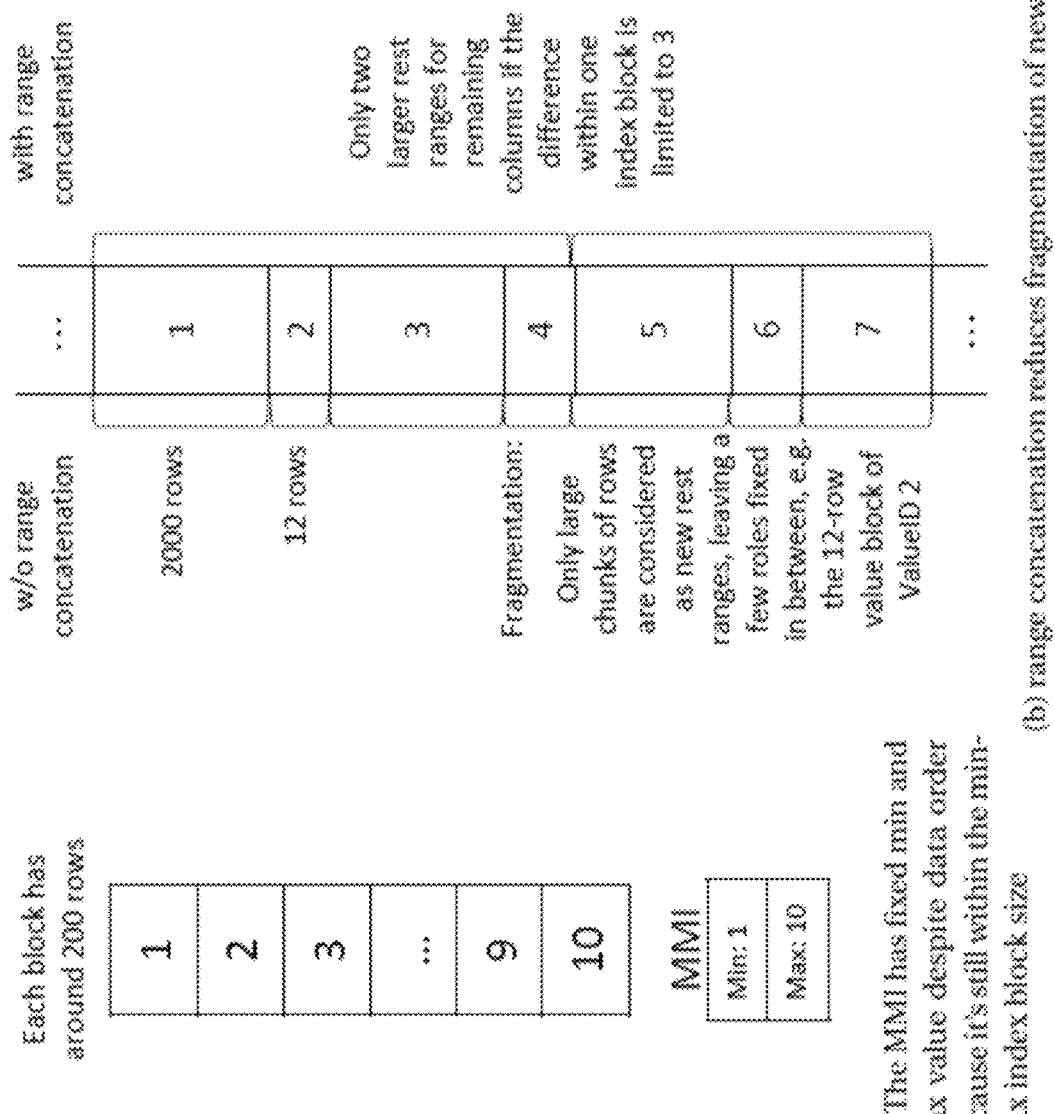
FIGS. 10(a) and 10(b) illustrate interdependence between range concatenation and min-max indexes.

The reason for concatenating ranges during the backward pass is threefold. Now that close value ids are grouped together due to sorting the rest range by value, including a few mathematically adjacent value ids in one min-max index block does not sacrifice the performance for range queries, as long as the difference of the min and max value in the block is small enough. FIG. 10(a) gives an example of a rest range containing 10 unique values with their frequencies around 200. If this range is covered exactly by one min-max index block, the min and max value of this block will not change regardless of the order of those value ids. Passing this whole range as a new rest range instead of 10 individual small ranges to remaining columns is better, due to the reason stated below.

On the other hand, this kind of concatenation serves as a compromise of MMIs for compression optimization because generating larger rest ranges gives more opportunities to remaining columns to reorder data. Suppose before starting the backward pass there is one rest range of two columns as shown in FIG. 9(a), sorting this range first on col2 and without concatenating the value blocks of value id 1 and 2 can cause value id 4 in col1 to be separated into two different places. With range concatenation, better compression can even be achieved when value id 4 is grouped together as shown in FIG. 9(b).

Thirdly, range concatenation can also help to reduce the fragmentation of rest ranges. Fragmentation can happen when there are many infrequent value ids among large chunk of value ids with a high frequency. Concatenating value blocks eliminates the chance of passing a block of very small size as a new rest range, which is not helpful at all and increases the runtime, as described by FIG. 10(b). The small chunk of value id 2, 4 and 6 will be concatenated with their previous value blocks to form a better range, avoiding a rest range of size 12. Although this concatenation solves the issue of fragmentation, but the effectiveness of MMIs is weakened because extra values may be included in a min-max index block and the improvement for compression is not obvious for the whole table because better compression in the remaining columns may be achieved at the expense of that of the current column.

That being said, there is one caveat with range concatenation for a rest range with many unique values of low frequencies, such as the case in FIG. 11. This whole range will be considered as a complete new rest range in the sorting-by-frequency strategy due to the low-frequency threshold of the infrequent-values part. But the range will be partitioned into several subranges, depending on the bound of concatenation, with range concatenation.

A new column selection order is now presented.

The compression optimization phase is dedicated to find an optimal solution globally, i.e. for the whole table, instead of for individual columns. However, columns can only be processed one by one due to the dependencies between them. In the forward pass, the range where the most frequent value information is updated is getting smaller as more columns are processed.

In the backward pass, the collection of rest ranges to be processed by the current column is generated after processing its previous column. As a result, the column selection order makes a difference to the final data order. This new column selection order idea is inspired by experiments.

Figure 12:
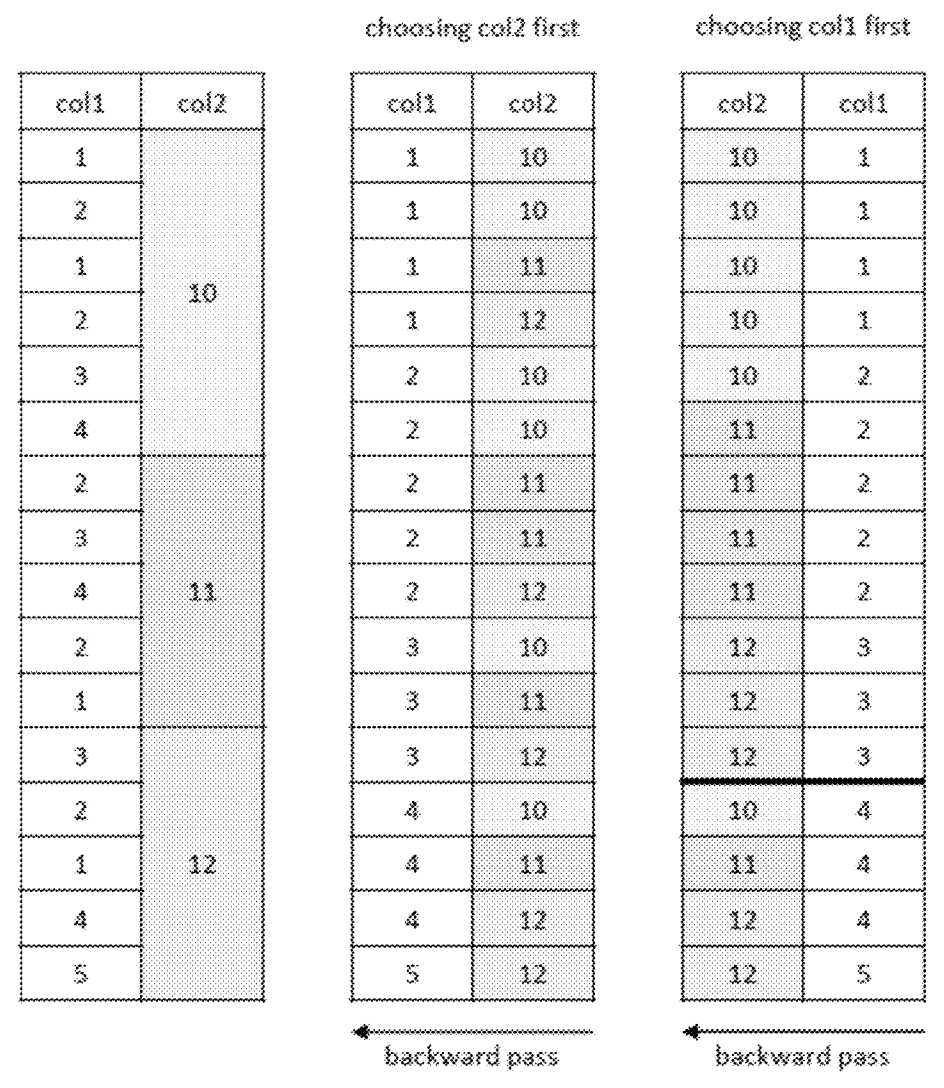

An optimal column selection order should not only help to fix more large ranges earlier, but also leave more freedom to remaining columns to reorder the data. That is the relative order of larger chunks of data should be fixed earlier, while the remaining columns can either further fix some relative order of slightly smaller chunks of rows or apply the sorting strategy to those chunks directly and set the sorted order as the final order. This can be done by letting the columns with large value blocks to be processed first. However, there is a nontrivial interdependency between the percentage of distinct values per column and range concatenation. If a column has too many distinct values, sorting the rest ranges by values and concatenating ranges will definitely generate smaller new rest ranges for remaining columns. Choosing columns with too few distinct values first will definitely create large rest ranges, but they can be too large and even as large as the whole column if there are only less than 10 distinct values in the column. Then the remaining columns will be processed approximately on this whole range as if there is no processing before, destroying the data order in those early chosen columns, as described in FIG. 12. This drawing has one partial range of the whole column, i.e. one rest range, of the whole column. Choosing col2 first and concatenating value blocks of value id 10, 11 and 12 gives the whole range to col1 to sort, so the order in col2 is totally destroyed. Run length encoding could have been applied on this column if there are not many different value ids interleaving with each other. But if col1 is chosen first, only the first 12 rows are concatenated and a good order can still be maintained in col2 after processing col1.

Therefore, during the backward pass, columns are not selected in the reversed order anymore, but some columns are prioritized. The number of distinct values is one of the main characteristics of a column, and is a determining factor during the reordering process. However, using the percentage of distinct values instead of the mere number fits more general cases for tables of various sizes. The following thresholds are proposed to categorize columns into three groups based on the percentage of distinct values: those that have too few distinct values, e.g. less than 1%, are in the few-values group; a column with too many distinct values is in the many values group and the rest columns are in the middle-values group. Three groups are selected in the order of middle-values group, few-values group and then followed by many-values group.

Figure 13:
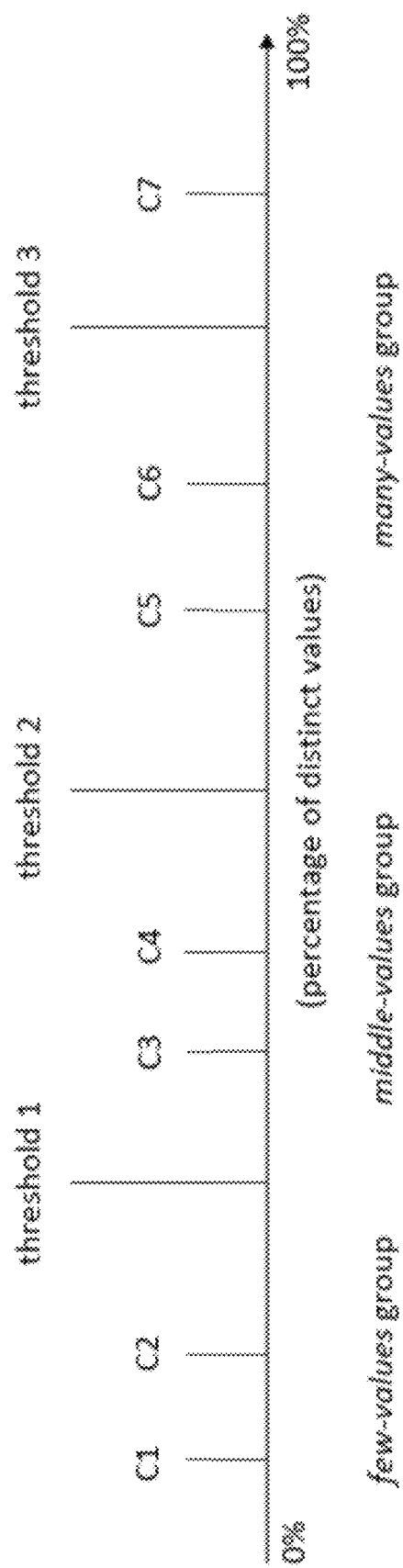
FIG. 13 illustrates three groups of columns of different percentages of distinct values, where middle-values group is prioritized.

As mentioned above, the middle-values group should be selected first because they have the appropriate percentage of distinct values. After processing them, new rest ranges of proper sizes are generated and the relative order of large chunks of rows is also established. At this moment, by selecting the few-values group, the probability to generate larger ranges are maximized, yet within the previous proper sizes, for columns in the many-values group. Columns are chosen in the ascending order of their percentages of distinct values within each group, as described by FIG. 13. The column selection order is c3, c4, c1, c2, c5 c6 and c7.

Three groups are determined by threshold 1 and 2. Threshold 3 is the limit mentioned earlier in the section on compression optimization, that a column is not considered as a candidate in the compression optimization phase if it has more percentage of distinct values than this threshold. However, those columns are now included in the backward pass considering that they can sort some part of the rows if there is still room, i.e. new rest ranges, for them after processing all previous better columns even though the total number of new rest ranges is decreasing. Adding them to the end of the backward pass does not affect all previous mentioned procedures either, but will create a better ordering in themselves if they got any rest ranges to sort. For example, if there are more than 2000 rows left after processing all columns under threshold 3, then it is better for both MMIs and compression size if a column with 80% distinct values (assuming 80% is larger than threshold 3) gets to sort the rest 2000 rows to have the same values grouped within this range. Improvements for a 2000-row range might not be obvious, but the more ranges are left, the better data order can be achieved because previously excluded columns now have more chances in determining the final data order.

This new order feature is not bound to the sorting-by-value strategy. It also works well when the sorting-by-frequency strategy is used. This is because the new column selection order essentially affects the construction of rest ranges for both sorting strategies in the same way, creating rest ranges of a reasonably large size and fixing the relative order of them as early as possible.

Framework and Experiments:

This section describes the technical difficulties encountered when experiments were carried out on the database management system, such as SAP HANA, and introduces the new framework developed for related experiments. This section further presents a few proof-of-concept experiments to illustrate the new ideas and explain the inspiration of them. Evaluation results of these ideas with the framework above are also presented. The results show that improvements are made in column scan performance with min-max index while compression is not sacrificed in most cases.

The framework is now described.

An existing implementation of SAP HANA is now described.

SAP HANA is a sophisticated product which contains many components, including but not limited to a query parser, a query plan generator, several optimizers, search stacks and column scanners. Executing one query using SQL from a very high level usually involves too many components, making it hard to measure the improvement of just two phases.

The purpose of the framework is now described.

It is therefore more suitable to develop a framework for the following experiments. The query execution is simulated with a unit test that only performs a column scan. This unit test only serves the basic persistence for SAP HANA in the framework, while the rest can be implemented with some low-level APIs. This way, the impact of other SAP HANA components is minimized. Besides scan time, another objective of the min-max index is to reduce the number of scanned rows, and thus reducing the amount of memory accessed. This aspect is independent from other SAP HANA components as well.

The features of the framework are now described.

Importing tables from csv files is one of the essential and basic features, which is not usually done on the unit test level but can be necessary for the experiments since it is not practical to have all data hard-coded. Besides, MMIs are built on the whole column in the existing system, but as mentioned above in the section on adaptive compression optimization, they are modified to deal with the prefix part separately in the framework. In addition, all ideas presented in the section above on adaptive compression optimization are fully integrated into the framework with a configuration file containing several parameters. All configurable parameters are listed in the table 1402 shown in FIG. 14. Further data processing pipelines are also developed to illustrate final comparison results in charts and tables.

Proof of concepts with TPC-H tables (i.e., tables associated with the decision support benchmark, TPC Benchmark™ H) is now described.

The new ideas of the adaptive compression optimization phase are shown via several proof of concept experiments below in this section with TPC-H tables. A general performance measurement experiment will be given further below. All columns are scanned using MMIs with the prefix part. Since the modification is not significant, it is not discussed separately. All the following experiments were done on a SUSE Linux Enterprise 12 SP1 workstation with 2 physical Intel Xeon E5-2667 Sandy Bridge CPUs (2.9 GHZ), each containing 6 cores with hyper-threading enabled. All the following scans on a column are done in a single thread with a query searching for all values that are less than the median value of the column, i.e. the less-than-median query. The query itself is not a variable of the experiment because a better data order should benefit MMIs for any queries despite various extents of improvement.

Only the LINEITEM and ORDERS table are selected for these proof-of-concept experiments because these two are the largest tables in the TPC-H benchmark. There are scaling_factor*6 million rows in the LINEITEM table and scaling_factor*1.5 million rows in the ORDERS table. Not all columns in these two tables are used in the experiments due to their similarities in terms of the percentage of distinct values. Besides, including more columns in the backward pass increases the experimental space rapidly because all permutations of all columns will be executed in different tests. Candidate columns are chosen based on the following conditions: (1) Exclude primary keys because there is usually a full inverted index on such columns which makes queries on them already fast enough; (2) Exclude columns that are not queried or rarely queried based on known statistics; (3) Exclude columns that have a faster compressed scan time compared to its uncompressed scan time in a priori experiments, because currently MMIs only work with uncompressed columns and changing a compressed column with a relatively good scan time and compression to the uncompressed form will not improve much; and (4) Choose columns with different percentages of distinct values as much as possible to cover the full spectrum of uniqueness.

Candidate columns of these two tables are listed in the table 1502 shown in FIG. 15.

Sorting-by-value strategy and range concatenation is now described.

Figures 16A, 16B:
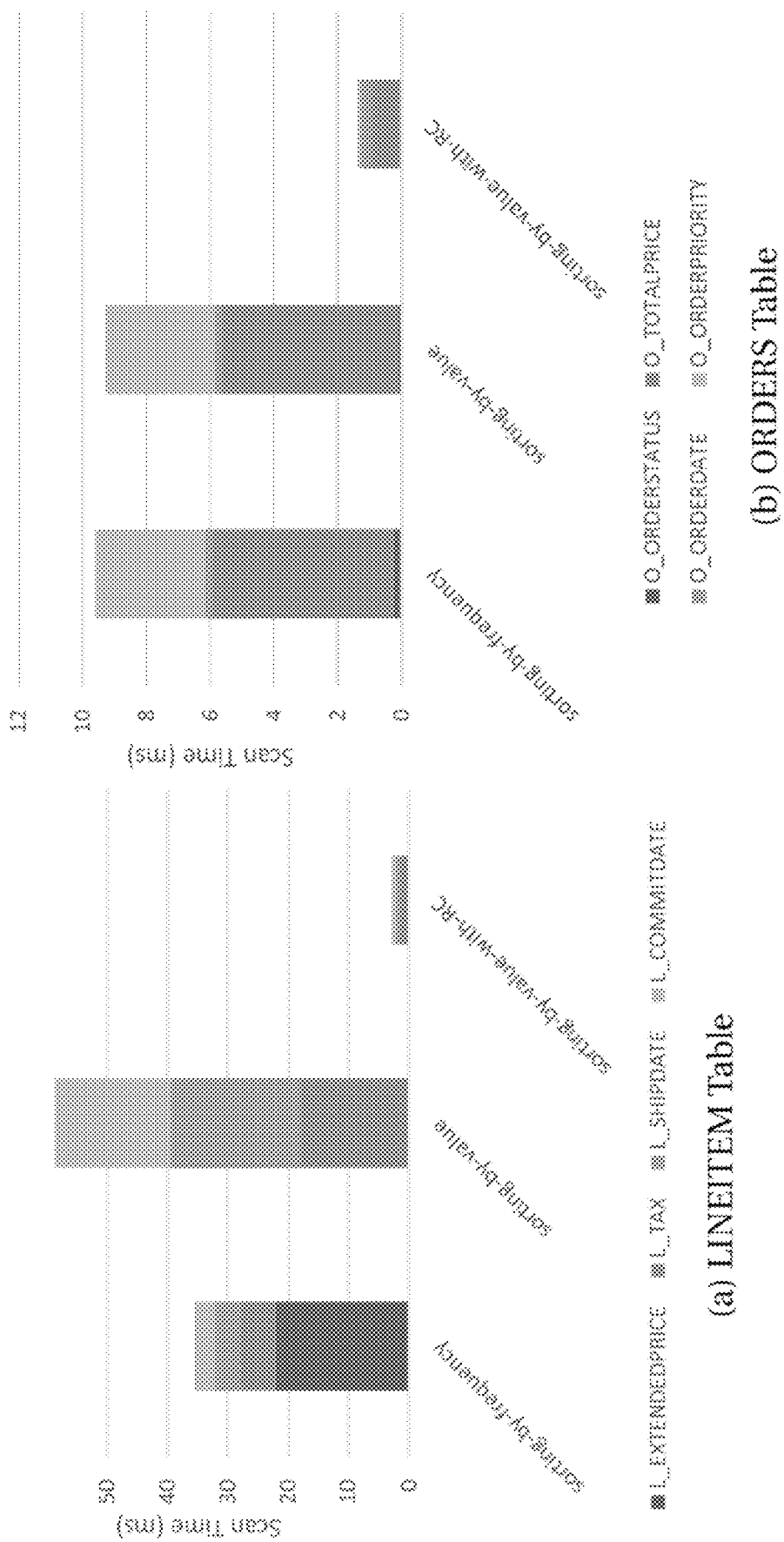
FIGS. 16(a) and 16(b) illustrate scan time on four columns of two TPC-H tables for the three cases of default sorting-by-frequency strategy, sorting-by-value strategy, and the sorting-by-value strategy with range concatenation respectively from left to right.

This disclosure analyzes the impact of sorting rest ranges by value instead of by value frequency in this section. This disclosure also explains why the sorting-by-value strategy requires range concatenation. FIGS. 16(*a*) and 16(*b*) illustrate scan time on four columns of two TPC-H tables. Three cases are the default sorting-by-frequency strategy, the sorting-by-value strategy and the sorting-by-value strategy with range concatenation respectively from left to right. More particularly, these drawings illustrate the scan time on four columns of the LINEITEM and the ORDERS table with scaling factor 1 from the TPC-H benchmark. The left bar on both charts represents the scan time with MMIs on the four columns after the original compression optimization, i.e. with the sorting-by-frequency strategy. The sorting strategy is changed to the sorting-by-value one in the middle bar, and range concatenation is further applied to compression optimization in the right bar. It is evident that the sorting-by-value strategy case is much worse than the original one in the LINEITEM table, whereas it is only slightly better in the ORDERS table. This is because the sorting-by-value strategy caused too much fragmentation in columns inevitably. However, the sorting-by-value strategy with range concatenation absolutely outperforms the default one in these two cases, almost by an order of magnitude.

Figures 17A, 17B:
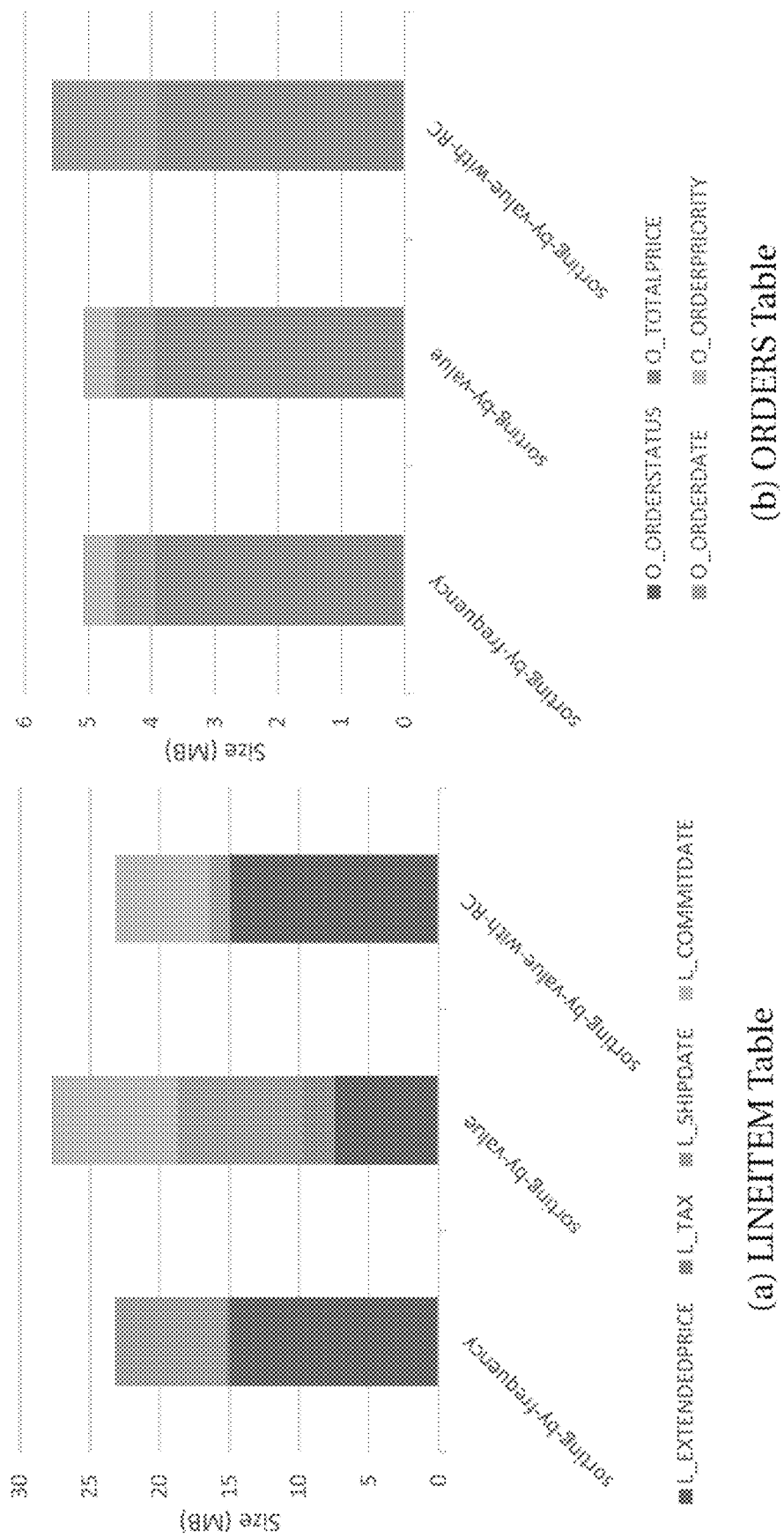
FIGS. 17(a) and 17(b) illustrate compression sizes on four columns of two TPC-H tables for the three cases of default sorting-by-frequency strategy, sorting-by-value strategy and the sorting-by-value strategy with range concatenation respectively from left to right.

FIGS. 17(*a*) and 17(*b*) shows compression sizes on four columns of two TPC-H tables. Three cases are the default sorting-by-frequency strategy, the sorting-by-value strategy and the sorting-by-value strategy with range concatenation respectively from left to right. These drawings illustrate that the compression size for the LINEITEM table is even smaller than the original size, and it is only less than 10% worse than the original size in the ORDERS table, but nearly 10 times faster scan time is achieved.

Column permutations are now described.

As mentioned in the section above on adaptive compression optimization, different column selection orders in both passes of compression optimization have different impact on the final data order, further leading to different compression schemes and scan performance. The forward pass should be kept as it is because moving up the most frequent values creates rest ranges for columns to sort in the backward pass. There is not much to change for this simple pass either. However, for the backward pass, selecting columns in a correct and better way is more important since it determines the final data order.

The experiments involved all permutations of the four columns in the two tables mentioned above as the column selection order of compression optimization. All the rest configuration involves neither the new sorting strategy nor range concatenation.

Figure 18:
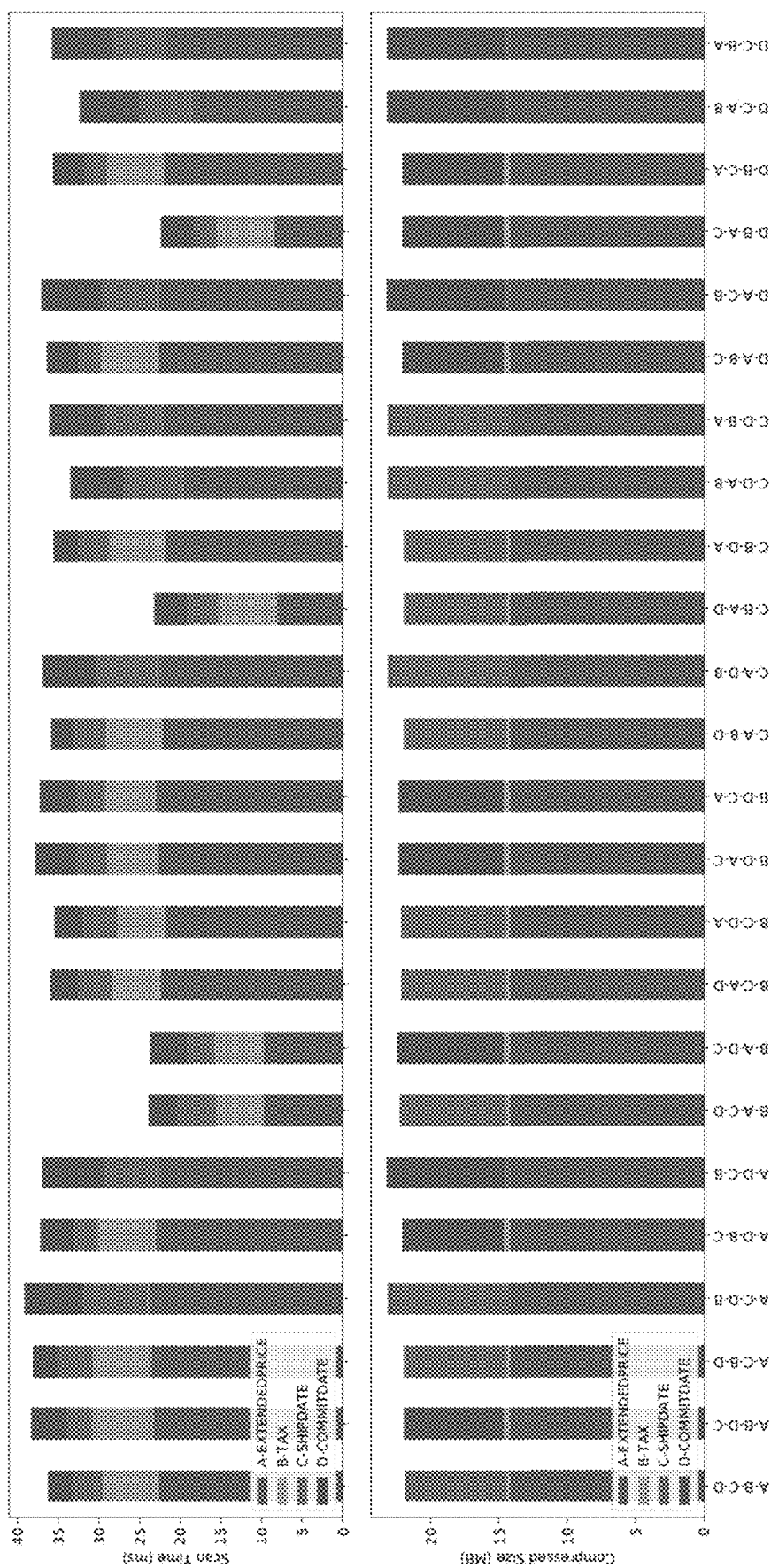
FIG. 18 illustrates the scan time and compression sizes for the LINEITEM table.
Figure 19:
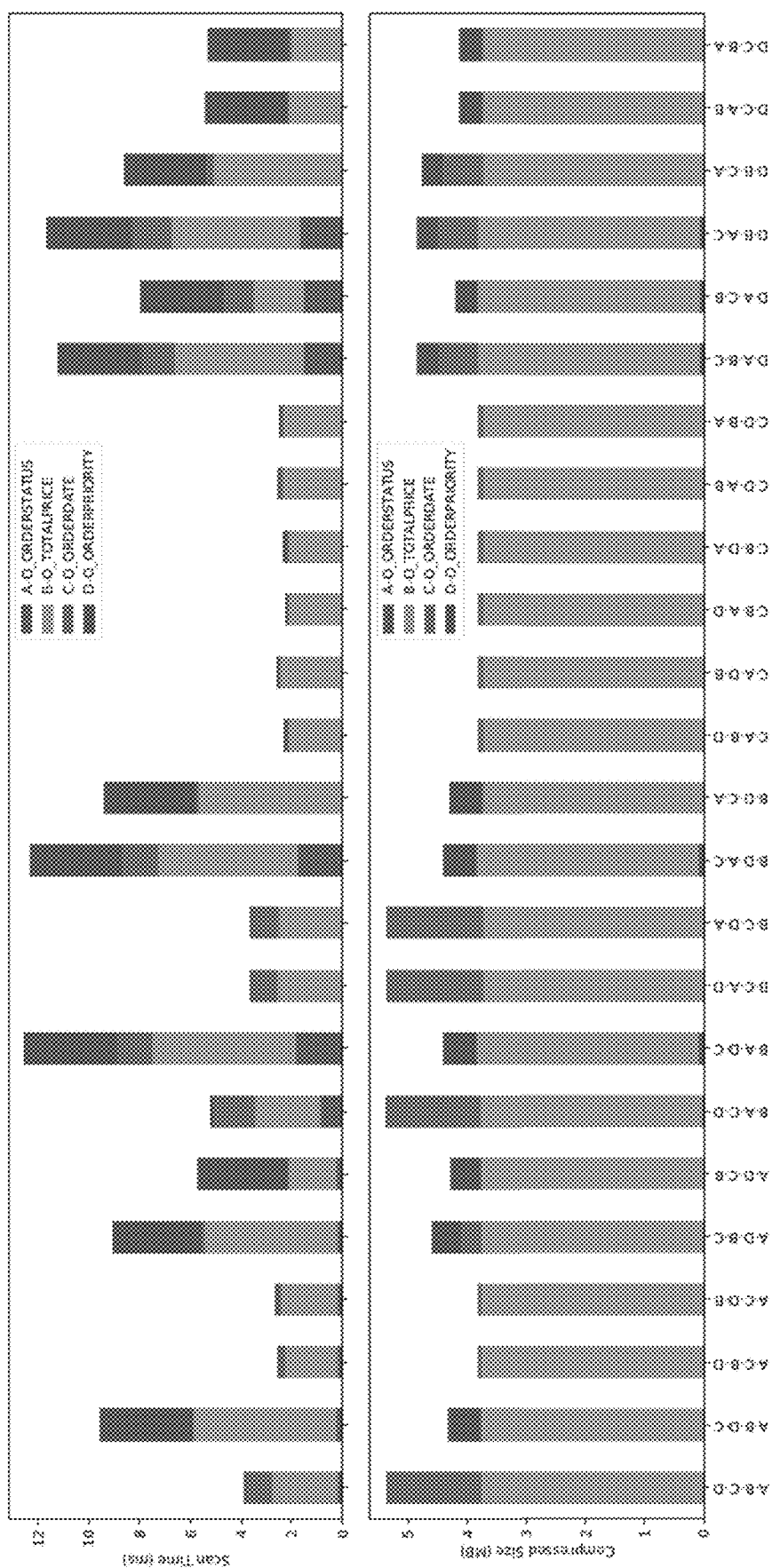
FIG. 19 illustrates the scan time and compression sizes for the ORDERS table.

FIG. 18 illustrates the scan times and the compression sizes of the four columns in the LINEITEM table in 24 tests where the only difference between them is the column selection order in the backward pass, and see FIG. 19 for the ORDERS table. The column sequence on the x axis in both figures represent the column selection order in the forward pass, and the order of the backward pass is the reverse of the forward-pass order. The default column selection order in the backward pass for two tables are A-D-B-C and C-B-D-A respectively. These figures also show that the compression sizes in both tables are not increased a lot while the scan times are reduced to half in certain cases. It is notable in FIG. 19 that both the compression size and the scan time become the smallest when the column C-O_ORDERDATE is chosen last during the backward pass (six cases before the last but six case from right to left). This is because column B-O_TOTALPRICE actually does not sort any part of the whole range, but passes every rest range it received to the next column, due to the fact that there are too many unique values in column B and thus the frequency of each value is lower than the infrequency threshold of the sorting-by-frequency strategy. It then becomes that column B does not have any impact on compression optimization in these 6 cases. This indicates that a column with too many unique values should be scheduled to the end of the backward pass, while having columns with a certain amount of unique values in the beginning. This pattern is also supportive of the recognized patterns discussed below.

Figure 20:
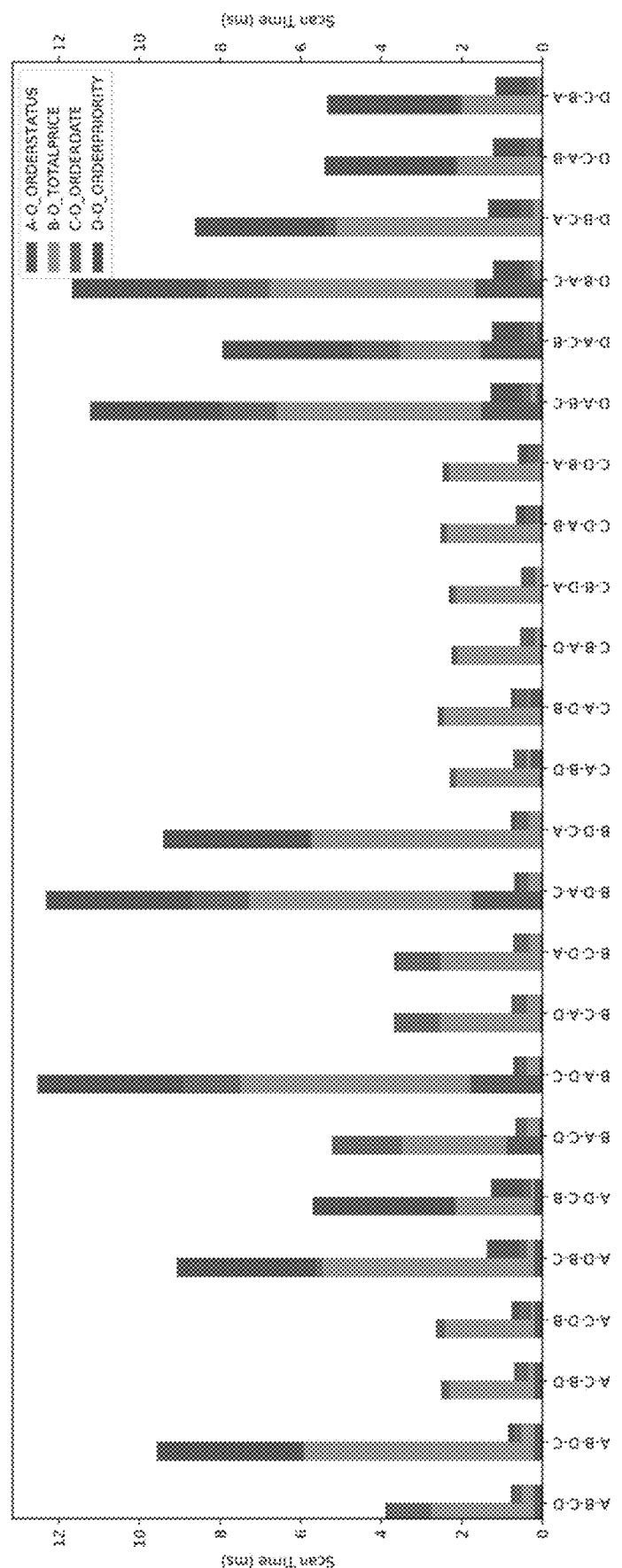
FIG. 20 illustrates the scan times for twenty four column permutations for the less-than-median range query.

The two sorting strategies—including range concatenation in the sorting-by-value strategy—are then compared in the 24 cases to see how different column selection orders affect the scan performance, as shown in FIG. 20. The left bar in the figure is the scan time after sorting the rest ranges by value frequency and the right bar represents the sorting-by-value strategy with range concatenation. However, since the sorting-by-value strategy with range concatenation beats the original one by far, it is hard to see the impact of different column selection orders. The reason is that better data orders largely benefit the less-than-median range queries, due to skipping most of the blocks.

Figure 21:
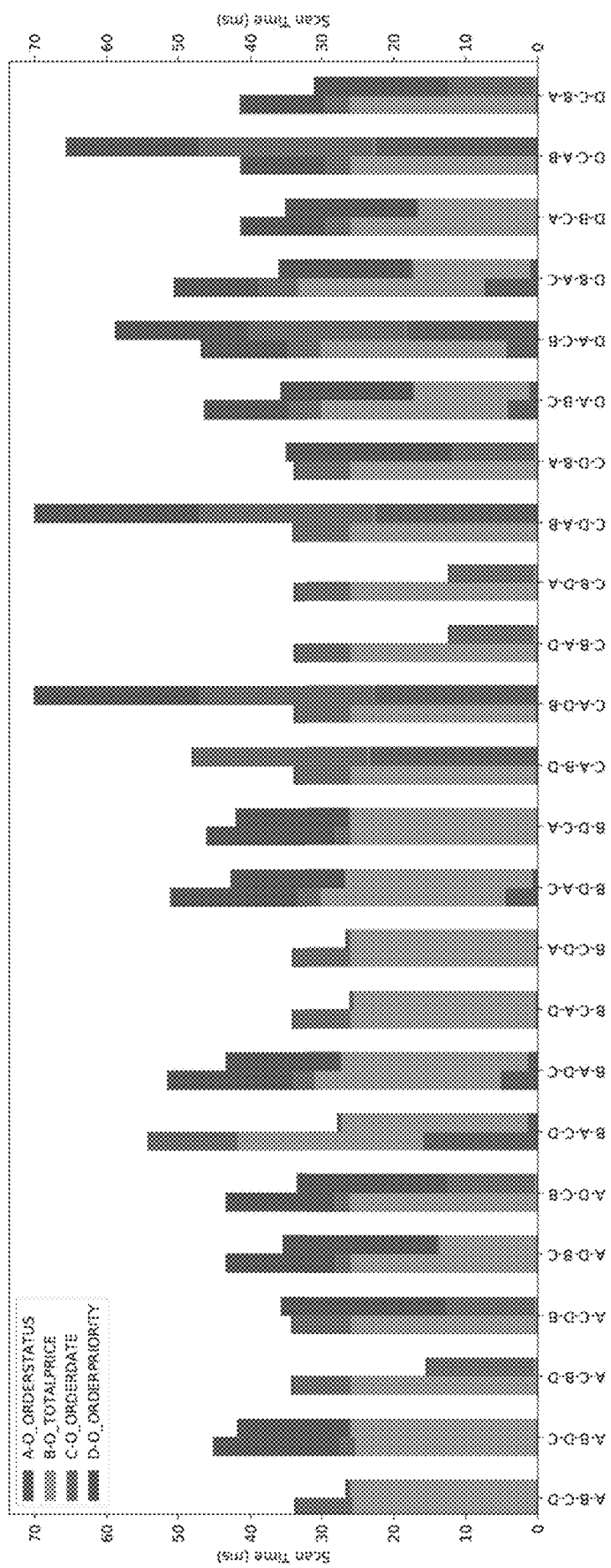
FIG. 21 illustrates scan times for twenty four column permutations for the equal-to-median point query.

By switching to an equal-to-median point query, FIG. 21 shows a pattern of the influence of different column selection orders. Only the charts of the ORDERS table are shown here, because the results of the LINEITEM table are similar.

Figure 22:
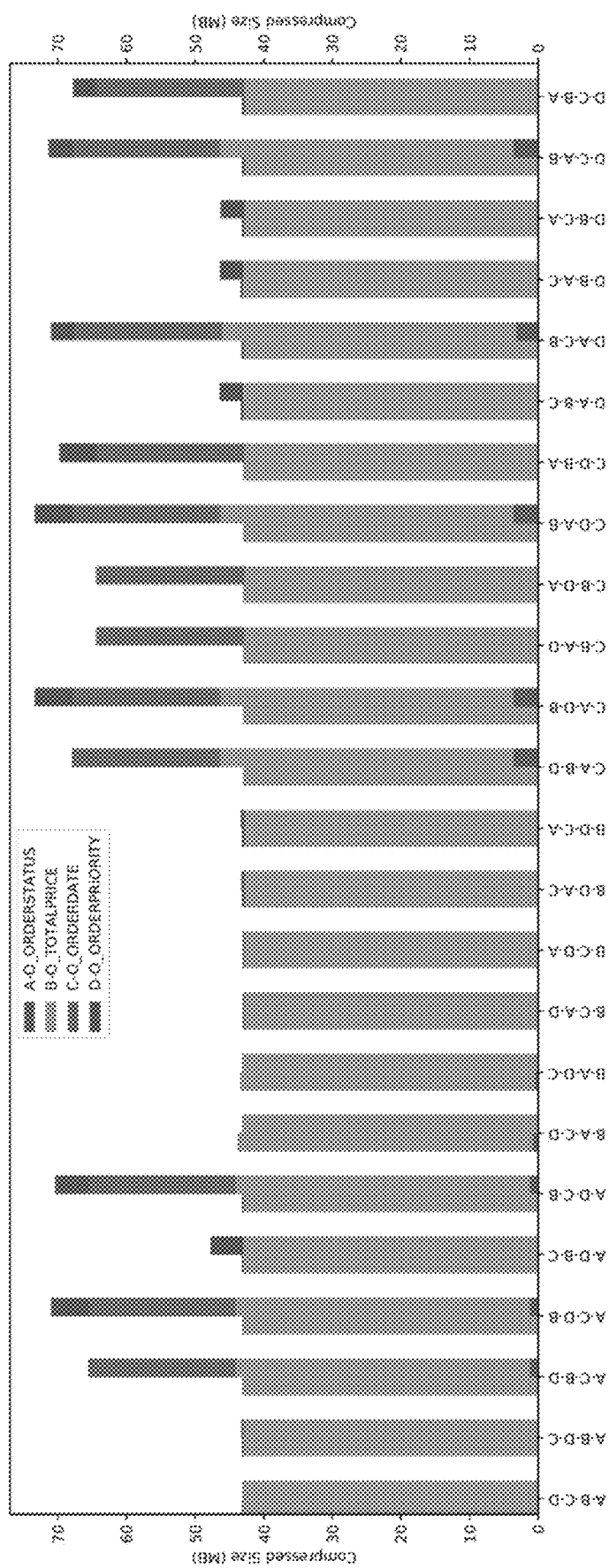
FIG. 22 illustrates compression sizes for twenty four column permutations for the equal-to-median point query.

FIG. 22 illustrates compression sizes for 24 column permutations for the equal-to-median point query. Two patterns can be recognized from FIGS. 21 and 22:

(1) Whenever column B-O_TOTALPRICE (orange column in the figures), the column with the most percentage of distinct values, is selected at the end of the forward pass, i.e. the first chosen one in the backward pass, the scan time on this column is negligible because it has the largest range to sort based on its own value ids. As in FIG. 21, the orange part on the right side of cases whose order ends in B is quite small, e.g. the fourth and the sixth case from left to right. However, the order in the rest three columns are destroyed as the scan time of those columns increases and their compression sizes are also increased as shown in FIG. 22. Besides, the compression size of column B-O_TOTALPRICE cannot be much better because it has too many unique values, around 79% in this table. So even letting this kind of columns sort first in the backward pass achieves a better order in this column, it will potentially destroy the final order of other columns. On the other hand, although columns that have a larger percentage of distinct values than threshold 3 as mentioned in Section 5.5 are excluded in compression optimization, they are now included in the end of the backward pass in the hope of some left rest ranges for them to sort after processing all other columns.

(2) It is clearly visible that the compression size of the column C-O_ORDERDATE becomes larger in certain cases. These cases share a common pattern that the column C-O_ORDERDATE is selected after the column B-O_TOTALPRICE in the backward pass, namely the column B-O_TOTALPRICE sorts the rest ranges first. This will let the column B-O_TOTALPRICE sort itself in larger ranges and leave more but smaller ranges for the column C-O_ORDERDATE. Considering that the column B-O_TOTALPRICE has the most percentage of distinct values while the column C-O_ORDERDATE has the second most, fewer values will be grouped together in the column C and thus results in worse compression. So this is also the reason that columns with a certain amount of distinct values should be prioritized first, as noted above. Better compression can be achieved not only in this column but also others if they are scheduled to sort based on themselves first while creating still large rest ranges for the remaining columns.

After having the idea that the middle-values group, as explained above, namely columns with a certain medium percentage of distinct values, should be prioritized in the backward pass, it is then natural to select the few-values group. Because there might be very few distinct values in rest ranges created by the middle-values group, involving the columns in the few-values group does not shrink the range sizes drastically which is better for later columns in the many-values group. The columns within each group are then selected in an ascending order due to the fact that smaller percentage of distinct values creates larger rest ranges due to range concatenation. Although the threshold 1 and 2 for dividing these three groups can be set arbitrarily, they cannot be set to a large value, otherwise the first column in the middle-values group will already have enough distinct values to fix too many rows. There is no good analytic model to calculate these thresholds because they are also dependent on the data in tables, but 1% and 15% can be used for threshold 1 and 2 based on empirical experiment results, for example.

Evaluation with real-world tables is now described.

General performance measurement is done in this section on 81 real-world tables, with the number of rows from 1 million to 20 million, the number of columns from 5 to 250 and the percentage of distinct values per column from 0.000018% to 100%. The query used in the following is still the less-than-median range query. The results for the equal-to-median query are similar. Another metric, also included in the following results, is the number of scanned rows. If the number of scanned rows by MMIs is smaller, it indicates both less scanning time and less memory bandwidth due to reading less blocks.

Compression optimization with new features added separately is now described.

Figure 23:
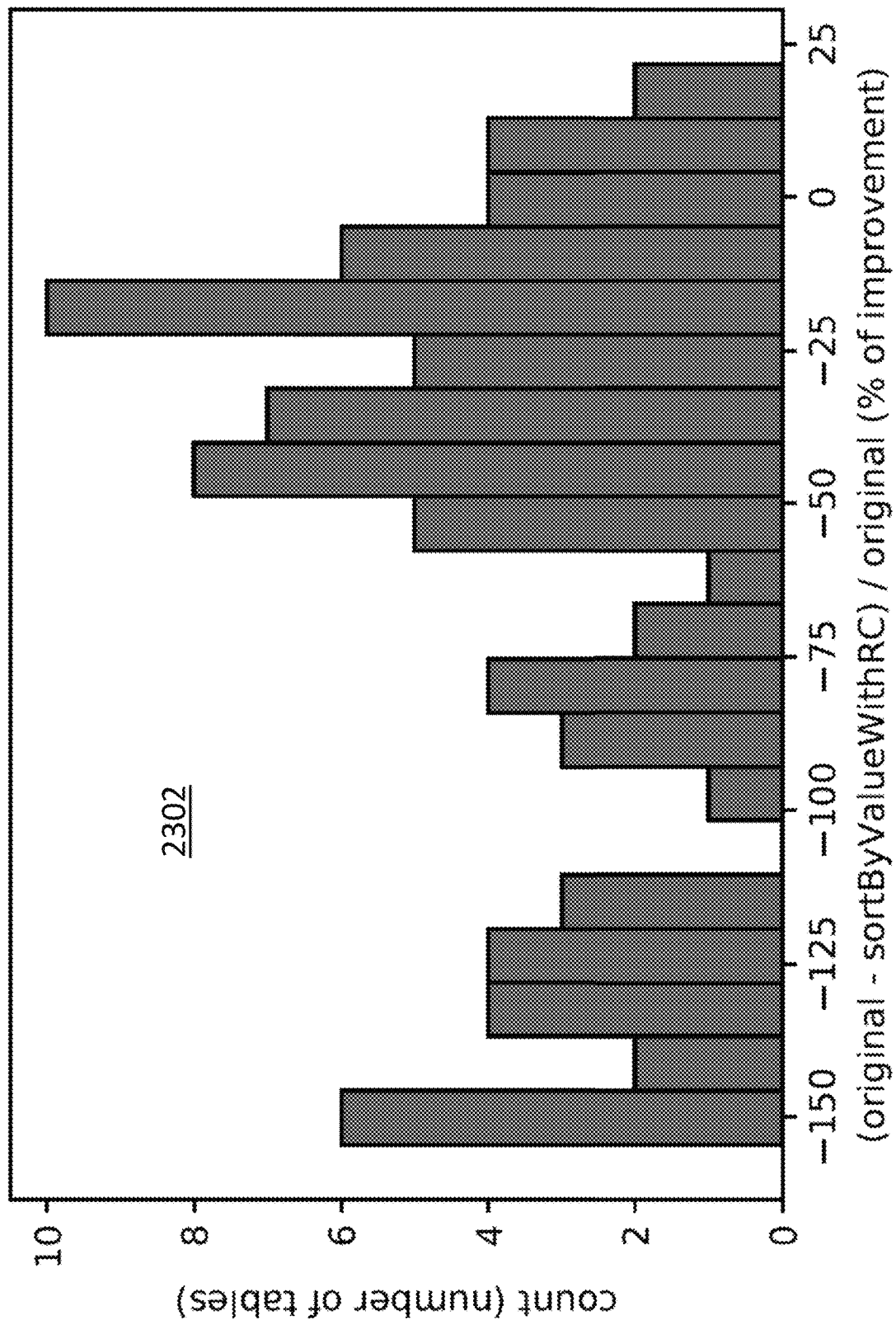
FIG. 23 illustrates a histogram of the improvement and the deterioration percentage in terms of scan time for the sorting-by-value strategy with range concatenation.

The sorting-by-value strategy with range concatenation and new column selection order is first applied to the original compression optimization separately to see their own impact. FIG. 23 illustrates the histogram 2302 of the improvement percentage calculated by the following formula in terms of scan time: {(original−sortByValueWithinRangeConcatenate)/original}. The x axis is the improvement percentage while the y axis is the number of cases in each range. The following histograms of the improvement percentage of different scenarios are drawn in a similar way, with x being the improvement calculated by the difference between two scenarios divided by the original value, i.e. in terms of scan time. The x axis is the improvement percentage while the y axis is the number of cases in each range. The following histograms of the improvement percentage of different scenarios are drawn in a similar way, with x being the improvement calculated by the difference between two scenarios divided by the original value, i.e. {(original−newScenario)/original}, in terms of different metrics. FIG.

23 indicates changing the sorting strategy with additional range concatenation is not enough to contribute to a better final data order form in-max indexes. The sorting-by-value strategy with range concatenation only leads to better scan performance in 8 cases, with a slight improvement only, less than 10%. As shown in FIG. 23, most cases are distributed on the negative part of the x axis.

Figure 24A:
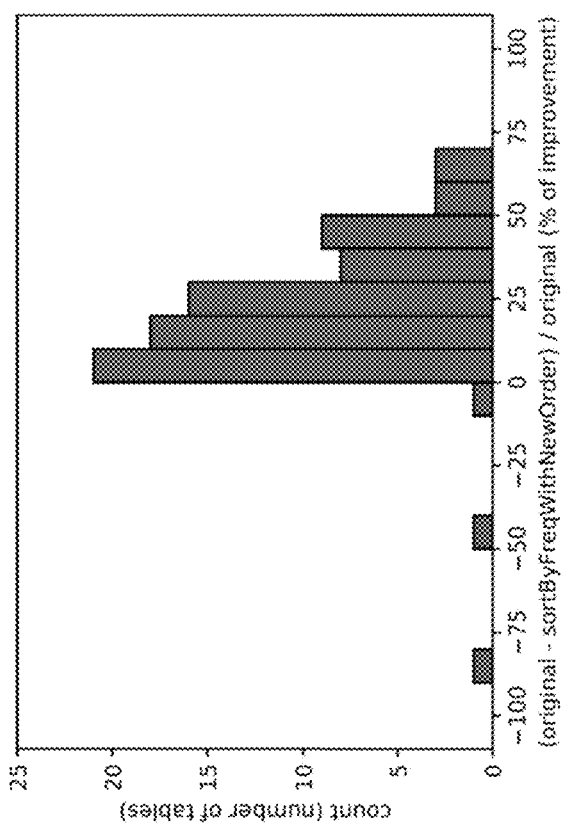
FIGS. 24(a) and 24(b) illustrate histograms of the improvement and the deterioration percentage for adding the new column selection order in compression optimization only in terms of scan metrics.
Figure 24B:
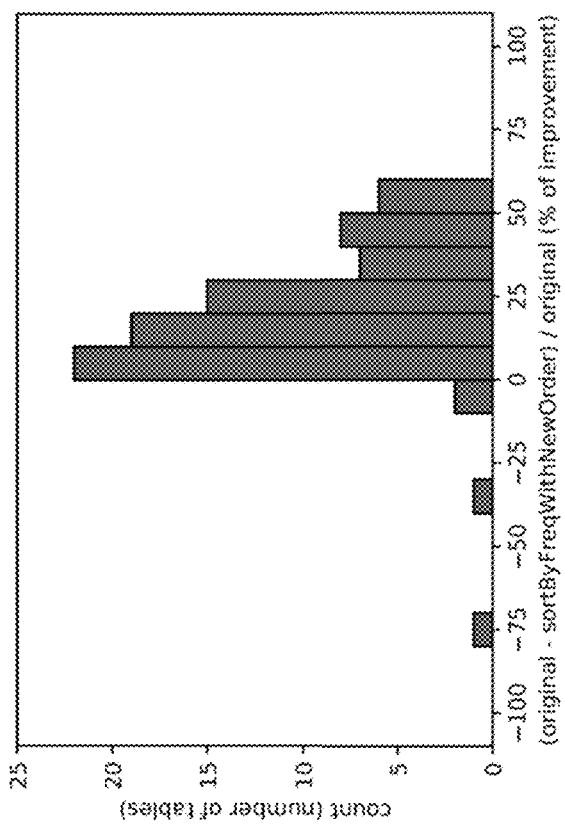

However, FIG. 24(a) and the table of FIG. 25 suggest by just adding the new column selection order feature in the original compression optimization phase is already impactful. Using this new selection order during adaptive compression optimization beats the original compression optimization in 77 out of 81 cases, though there are only 18% improvement in terms of scan time in half tables. The results for the number of scanned rows are similar in FIG. 24(b) and the table of FIG. 25. So the new column selection order turns out to be a more influential feature.

Figure 27B:
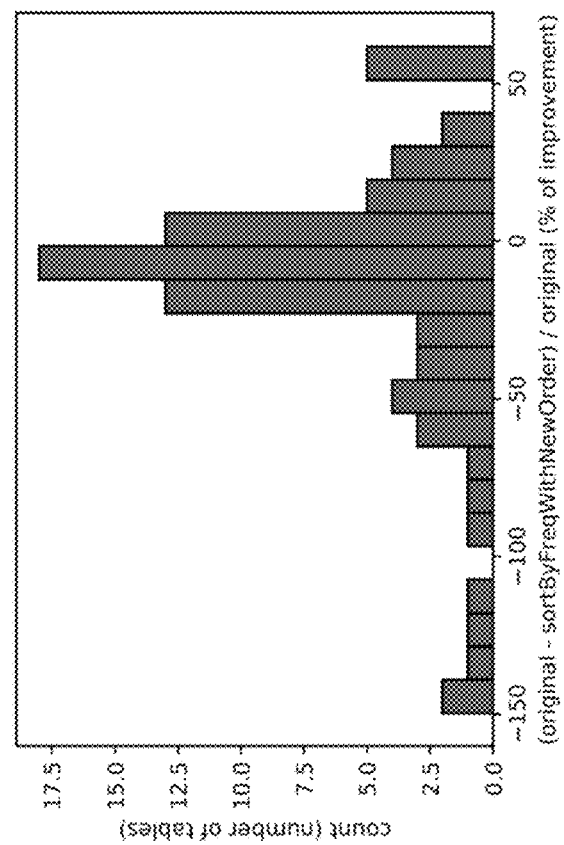
FIGS. 27(a) and 27(b) illustrate histograms of the improvement and the deterioration percentage for adding the new column selection order in compression optimization only in terms of compression metrics.
Figure 27A:
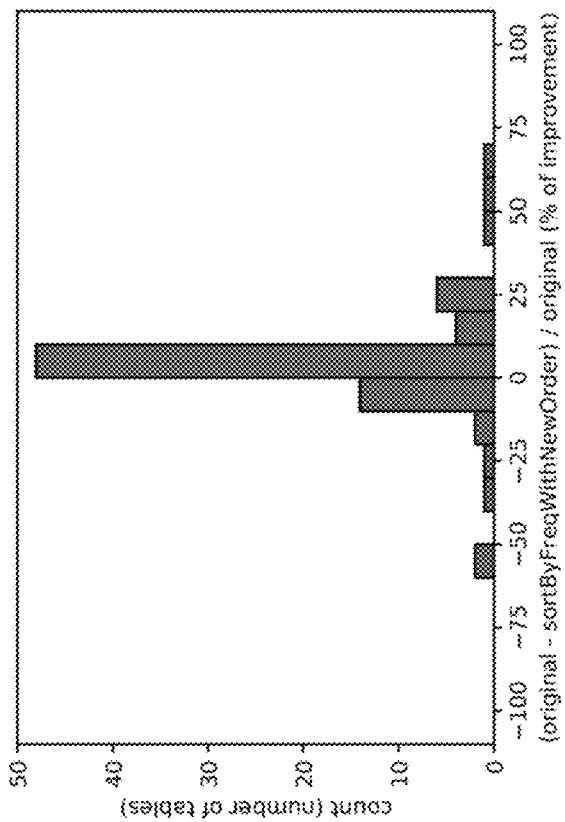

In addition, the compression size is even decreased in 61 tables, though only by a small percentage less than 10% in 45 tables (the 75% value), see the table of FIG. 26 and FIG. 27(a). The new order also causes a compression size increase in other 20 cases, but only by a small amount, 3% for half tables. At the same time, although there is an increase in compression optimization time in 57 cases (see FIGS. 26 and 27(b)), it is still better than the increase in adaptive compression optimization, where one quarter of the tables take more than 50% longer time as discussed below.

Adaptive compression optimization is now discussed.

Figure 28B:
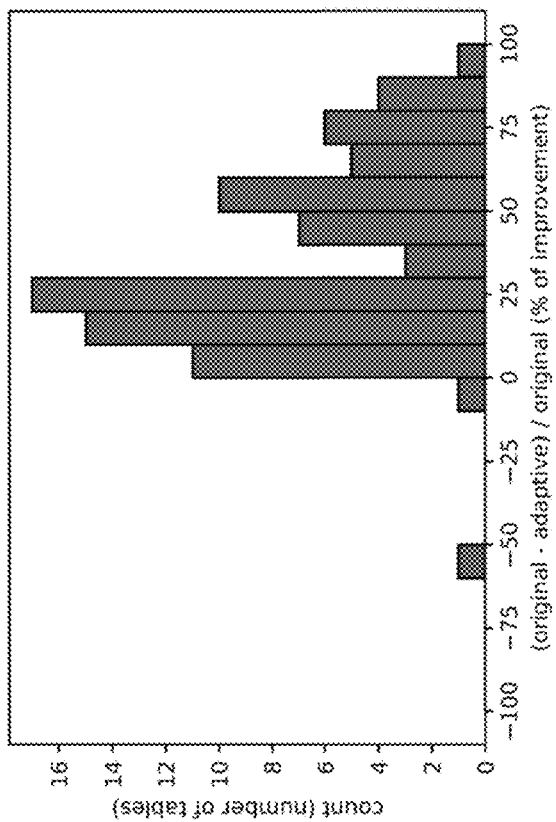
FIGS. 28(a) and 28(b) illustrate histograms of improvement percentage of adaptive compression optimization compared to the original one in terms of scan metrics.
Figure 28A:
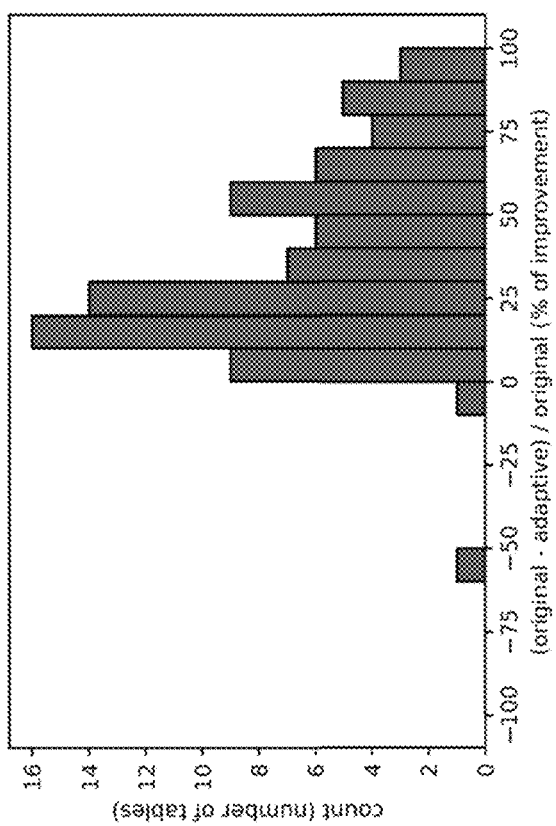

After replacing the original compression optimization with adaptive compression optimization, i.e. the combination of the sorting-by-value strategy, range concatenation and the new column selection order, the scan time and the number scanned rows are reduced on 79 out of 81 tables in our experiment, as shown in FIGS. 28(a) and 28(b). The median value 28.06% (in the table of FIG. 29) of the positive side of FIG. 28(a) suggests that the scan time after adaptive compression optimization is decreased by more than 28% in half of the tables compared to that after the original compression optimization. The scanning on half tables with MMIs after adaptive compression optimization skips 30% more number of rows than that of the original compression optimization.

Figure 30B:
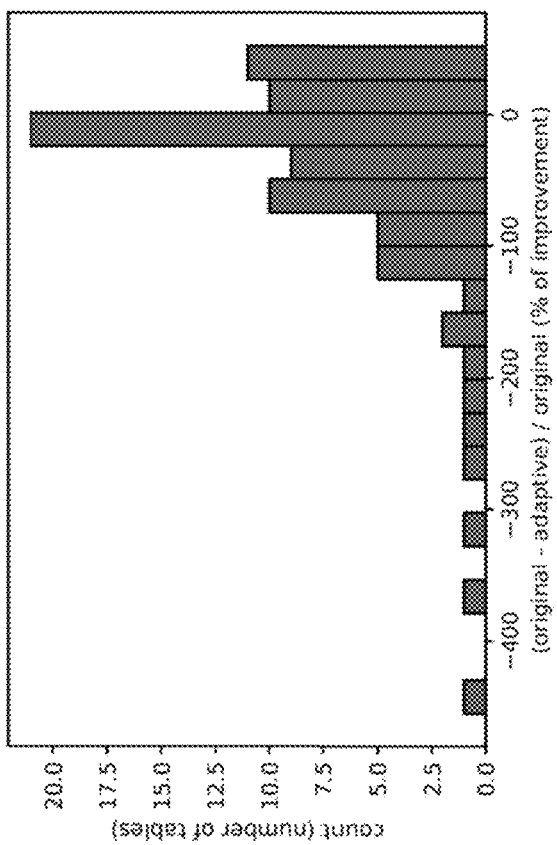
FIGS. 30(a) and 30(b) illustrate histograms of improvement percentage of adaptive compression optimization compared to the original one in terms of scan metrics.
Figure 30A:
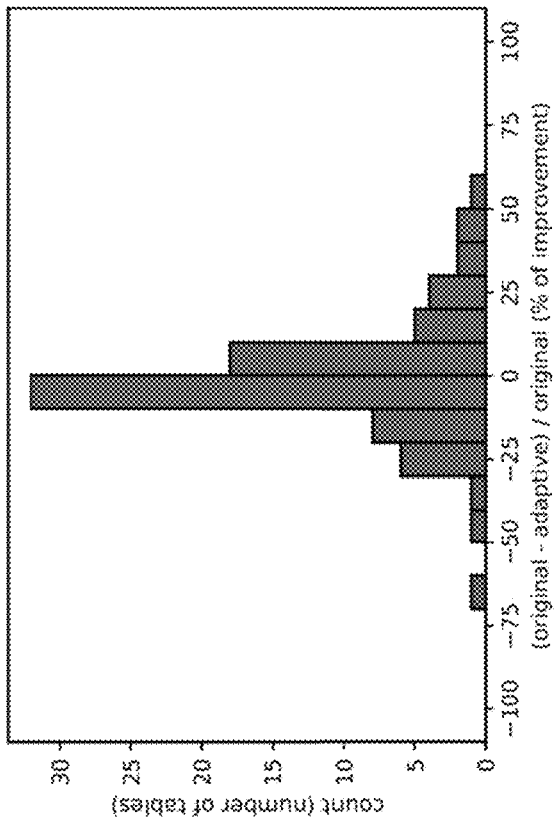

On the other hand, the compression metrics, i.e. compression size and compression optimization time are not worse in all cases. FIGS. 30(a) and 30(b) illustrate the percentage of setback comparing adaptive compression optimization to the original compression optimization. FIG. 30(a) shows even though there are 49 cases where the adaptive compression optimization causes worse compression size, more than 36 tables (25%) have larger size by less than 17%. The compression optimization time, however, is indeed worse than the original compression optimization on average. The table of FIG. 31 reveals that in half tables the compression optimization time gets more than 56% longer. This is because there is no early stop in sorting rest ranges using the sorting-by-value strategy with range concatenation. A rest range is always split into smaller ranges for the remaining columns as long as the range size is larger than the min-max index block size in the sorting-by-value setting, whereas the range is not split if all its value frequencies are less than a certain threshold, e.g. the min-max index block size. The number of rest ranges also increases in the adaptive compression optimization, which leads to longer execution time.

General Remarks:

The changes incorporated into the adaptive compression optimization take min-max index performance into account, while also considering compression measurement metrics, achieving a trade-off between longer compression optimization time, or larger compression sizes for certain cases, and better data order, i.e. faster scan time with MMIs. Incorporating all new features into adaptive compression optimization gives the best results in terms of both scan time and compression size for most cases, but the compression optimization time certainly becomes longer than the original compression optimization. If longer execution time is not tolerable, simply switching to the new column selection order already helps in some cases while reducing the time increase yet giving comparable outcome for MMIs and compression itself. Despite that, it does not mean the sorting-by-value strategy with range concatenation is not useful. The new sorting strategy still assists the adaptive compression optimization to beat the original compression optimization with the new column selection order in most cases in terms of scan time. Furthermore, the sorting-by-value strategy is more feasible with range concatenation.

Additional Architectural Details

Figure 32:
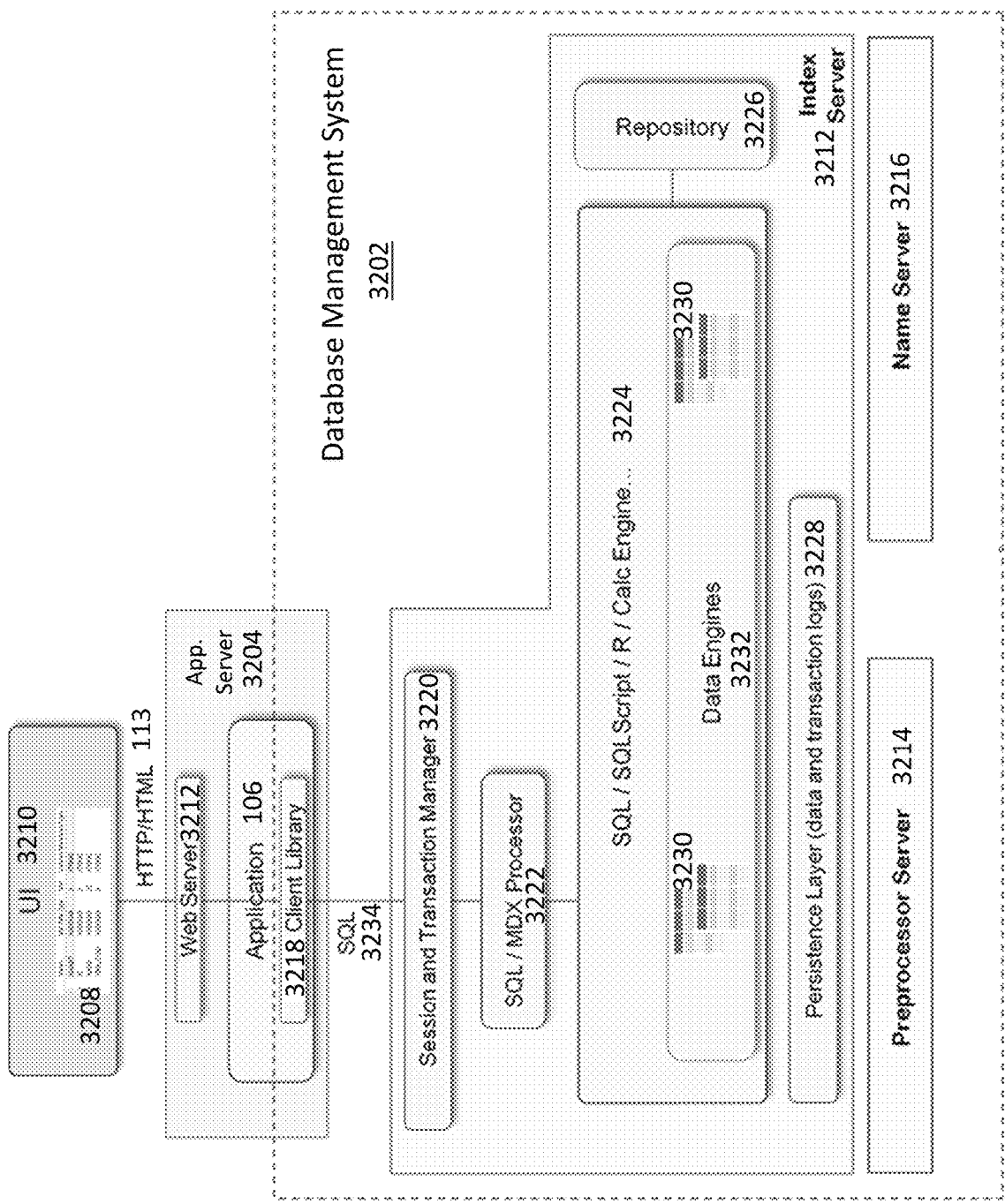
FIG. 32 illustrates an architecture of the database management system, such as SAP HANA.

FIG. 32 illustrates an architecture of the database management system, such as SAP HANA, 3202. The database management system 3202 can communicate with an application server 3204. The application server 3204 can host an application 3206, content 3208 from which can be transmitted to a user interface 3210 via the web server 3212. The web server 3212 can transmit the content to the user interface 3210 via HyperText Transfer Protocol (HTTP) or Hyper Text Markup Language (HTML) 3213.

The database management system 3202 can include an index server 3212, a preprocessor server 3214, a name server 3216, and a client library 3218 of the application server 3204. The index server 3204 can include a session and transaction manager 3220, a processor (e.g., structured query language (SQL) processor/multi-dimension expressions (MDX) processor) 3222, an engine (e.g., SQL/SQL script engine) 3224, a repository 3226, and a persistence layer 3228. The engine 3224 can include data stores 3230 and data engines 3232 to process the data in those data stores 3230. The persistence layer 3228 can include data and transaction logs, which are implemented as internal database tables. There can be one internal database table for each tenant. The internal database tables 3228 can store metadata, which can be managed by a catalog master service specific for the tenant. Each tenant can have a separate catalog master service so as to isolate tenants from each other, because a user in one tenant database must not see configuration changes made in another tenant. The application 3206 can access and manage content within the index server 3212 via a query programming language 3234, such as SQL or MDX.

The database management system 3202 can have its own scripting language (e.g., SQLScript). The scripting language can be based on functions that operate on tables 3228 using queries (e.g., SQL queries) for set processing, and can therefore be parallelizable over multiple processors 3222.

Further, the database management system 3202 can support a framework for the installation of specialized and optimized functional libraries 3218, which can be tightly integrated with different data engines 3232. The functions within the library 3218 can be called directly from within the scripting language.

The query language (e.g., SQL) 3234 and the scripting language (e.g., SQLScript) can be implemented using a common infrastructure of built-in functions of the data engine 3232 that have access to various meta definitions, such as definitions of relational tables, columns, views, and indexes, and definitions of procedures for the scripting language (e.g., SQLScript). This metadata can be stored in one common catalog.

The database persistence layer 3228 can be responsible for durability and atomicity of transactions. It can ensure that the database 3226 can be restored to the most recent committed state after a restart and that transactions can be either completely executed or completely undone.

The index server 3212 can use the preprocessor server 3214 for analyzing text data and extracting the information on which the text search capabilities are based. The name server 3216 can own the information about the topology of the database management system 3202. In a distributed system, the name server 3216 can know where the components are running and which data is located on which server. Additional/Alternate Implementations:

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that a non-recited feature or element is also permissible.

The subject matter described herein can be embodied in systems, apparatuses, methods, and/or articles. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method comprising:

reordering, by a database management system, at least a first data vector for a first column of a database table and a second data vector for a second column of the database table using a forward pass followed by a backward pass, wherein the forward pass sorts, based on frequency of occurrence, at least the first data vector and the second data vector, wherein the backward pass prioritizes a selection order of the first data vector or the second data vector based on a number of distinct value identifiers in a rest range of at least one of the first data vector or the second data vector, wherein the backward pass sorts by sorting the rest range in at least the first data vector and the second data vector by at least grouping close value identifiers together, wherein at least one rest range is prevented from being split during the sorting;

determining, by the database management system and for at least the first data vector, a prefix part and a non-prefix part;

generating, by the database management system, a min-max index for the non-prefix part associated with the first data vector; and storing, for at least the first data vector, a value of the prefix part and a length of the prefix part.

2. The method of claim 1, wherein the backward pass prioritizes the selection order of the first data vector over the second data vector, in response to the first data vector having a higher quantity of distinct values of value identifiers when compared to the second data vector.

3. The method of claim 1, wherein the backward pass further comprises grouping close value identifiers together.

4. The method of claim 1, further comprising: encoding, by the database management system, data of at least the first column and the second column of the database table to generate a plurality of data vectors including the first data vector for the first column and the second data vector for the second column.

5. The method of claim 4, wherein the encoding comprises dictionary encoding.

6. The method of claim 1, wherein the forward pass comprises moving-up, by the database management system, a most frequently occurring value in at least one of the first data vector or the second data vector.

7. A system comprising:
at least one processor; and
at least one memory including code which when executed by the at least one processor causes operations comprising:

reordering, by a database management system, at least a first data vector for a first column of a database table and a second data vector for a second column of the database table using a forward pass followed by a backward pass, wherein the forward pass sorts, based on frequency of occurrence, at least the first data vector and the second data vector, wherein the backward pass prioritizes a selection order of the first data vector or the second data vector based on a number of distinct value identifiers in a rest range of at least one of the first data vector or the second data vector, wherein the backward pass sorts by sorting the rest range in at least the first data vector and the second data vector by at least grouping close value identifiers together, wherein at least one rest range is prevented from being split during the sorting;

determining, by the database management system and for at least the first data vector, a prefix part and a non-prefix part;

generating, by the database management system, a min-max index for the non-prefix part associated with the first data vector; and storing, for at least the first data vector, a value of the prefix part and a length of the prefix part.

8. The system of claim 7, wherein the backward pass prioritizes the selection order of the first data vector over the second data vector, in response to the first data vector having a higher quantity of distinct values of value identifiers when compared to the second data vector.

9. The system of claim 7, wherein the backward pass further comprises grouping close value identifiers together.

10. The system of claim 7, further comprising: encoding, by the database management system, data of at least the first column and the second column of the database table to generate a plurality of data vectors including the first data vector for the first column and the second data vector for the second column.

11. The system of claim 10, wherein the encoding comprises dictionary encoding.

12. The system of claim 7, wherein the forward pass comprises moving-up, by the database management system, a most frequently occurring value in at least one of the first data vector or the second data vector.

13. A non-transitory computer-readable medium storing instructions that, when executed by a computer, cause operations comprising:

reordering, by a database management system, at least a first data vector for a first column of a database table and a second data vector for a second column of the database table using a forward pass followed by a backward pass, wherein the forward pass sorts, based on frequency of occurrence, at least the first data vector and the second data vector, wherein the backward pass prioritizes a selection order of the first data vector or the second data vector based on a number of distinct value identifiers in a rest range of at least one of the first data vector or the second data vector, wherein the backward pass sorts by sorting the rest range in at least the first data vector and the second data vector by at least grouping close value identifiers together, wherein at least one rest range is prevented from being split during the sorting;

determining, by the database management system and for at least the first data vector, a prefix part and a non-prefix part;

generating, by the database management system, a min-max index for the non-prefix part associated with the first data vector; and storing, for at least the first data vector, a value of the prefix part and a length of the prefix part.

14. The non-transitory computer-readable medium of claim 13, wherein the backward pass prioritizes the selection order of the first data vector over the second data vector, in response to the first data vector having a higher quantity of distinct values of value identifiers when compared to the second data vector.

15. The non-transitory computer-readable medium of claim 13, wherein the backward pass further comprises grouping close value identifiers together.

16. The non-transitory computer-readable medium of claim 13, further comprising: encoding, by the database management system, data of at least the first column and the second column of the database table to generate a plurality of data vectors including the first data vector for the first column and the second data vector for the second column.

17. The non-transitory computer-readable medium of claim 16, wherein the encoding comprises dictionary encoding.

18. The non-transitory computer-readable medium of claim 13, wherein the forward pass comprises moving-up, by the database management system, a most frequently occurring value in at least one of the first data vector or the second data vector.

* * * * *